(12) United States Patent
Ohtake et al.

(10) Patent No.: US 9,087,798 B2
(45) Date of Patent: Jul. 21, 2015

(54) ETCHING METHOD

(71) Applicant: Tokyo Electron Limited, Tokyo (JP)

(72) Inventors: Hiroto Ohtake, Miyagi (JP); Akinori Kitamura, Miyagi (JP); Hironori Matsuoka, Miyagi (JP); Yoko Noto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/456,059

(22) Filed: Aug. 11, 2014

(65) Prior Publication Data

US 2015/0044877 A1 Feb. 12, 2015

(30) Foreign Application Priority Data

Aug. 12, 2013 (JP) .................. 2013-167515

(51) Int. Cl.
| | |
|---|---|
| *H01L 21/302* | (2006.01) |
| *H01L 21/3213* | (2006.01) |
| *H01L 29/66* | (2006.01) |
| *H01L 21/311* | (2006.01) |
| *H01J 37/32* | (2006.01) |

(52) U.S. Cl.
CPC ..... *H01L 21/32136* (2013.01); *H01J 37/32082* (2013.01); *H01L 21/31116* (2013.01); *H01L 21/31144* (2013.01); *H01L 21/32139* (2013.01); *H01L 29/6681* (2013.01); *H01L 29/66795* (2013.01)

(58) Field of Classification Search
CPC ................. H01L 21/31116; H01L 21/31138; H01L 21/311; H01L 21/32136; H01L 21/32139; H01L 21/31144
USPC ......... 438/706, 710, 712, 714, 716, 720, 725, 438/736; 216/58, 67, 68
See application file for complete search history.

(56) References Cited

U.S. PATENT DOCUMENTS

| | | | |
|---|---|---|---|
| 7,718,538 B2 | 5/2010 | Kim et al. | |
| 2008/0197110 A1 | 8/2008 | Kim | |
| 2008/0206901 A1* | 8/2008 | Kim et al. | ........................ 438/9 |
| 2013/0029494 A1 | 1/2013 | Sasaki | |
| 2013/0052833 A1* | 2/2013 | Ranjan et al. | ................. 438/714 |
| 2014/0329390 A1 | 11/2014 | Inoue | |

FOREIGN PATENT DOCUMENTS

| | | |
|---|---|---|
| JP | 2012-084872 A | 4/2012 |
| WO | 2012/111461 A1 | 8/2012 |

* cited by examiner

*Primary Examiner* — Lan Vinh

(74) *Attorney, Agent, or Firm* — Pearne & Gordon LLP

(57) ABSTRACT

An etching method can improve etching accuracy as well as secure selectivity when forming a dummy gate of a fin-type field effect transistor. In the etching method, the dummy gate of a fin-type field effect transistor is formed with a target object. In the etching method, a gate material deposited between multiple fins is etched by using surface wave plasma. A pressure in the etching method is 50 mTorr (6.67 Pa) or more, a frequency of a power to be applied to a mounting table configured to mount thereon the target object is in a range of 10 Hz or more to 200 Hz or less, and the power is pulse-modulated such that a duty ratio as a ratio of an ON-time to a pulse cycle is 50% or less.

3 Claims, 19 Drawing Sheets

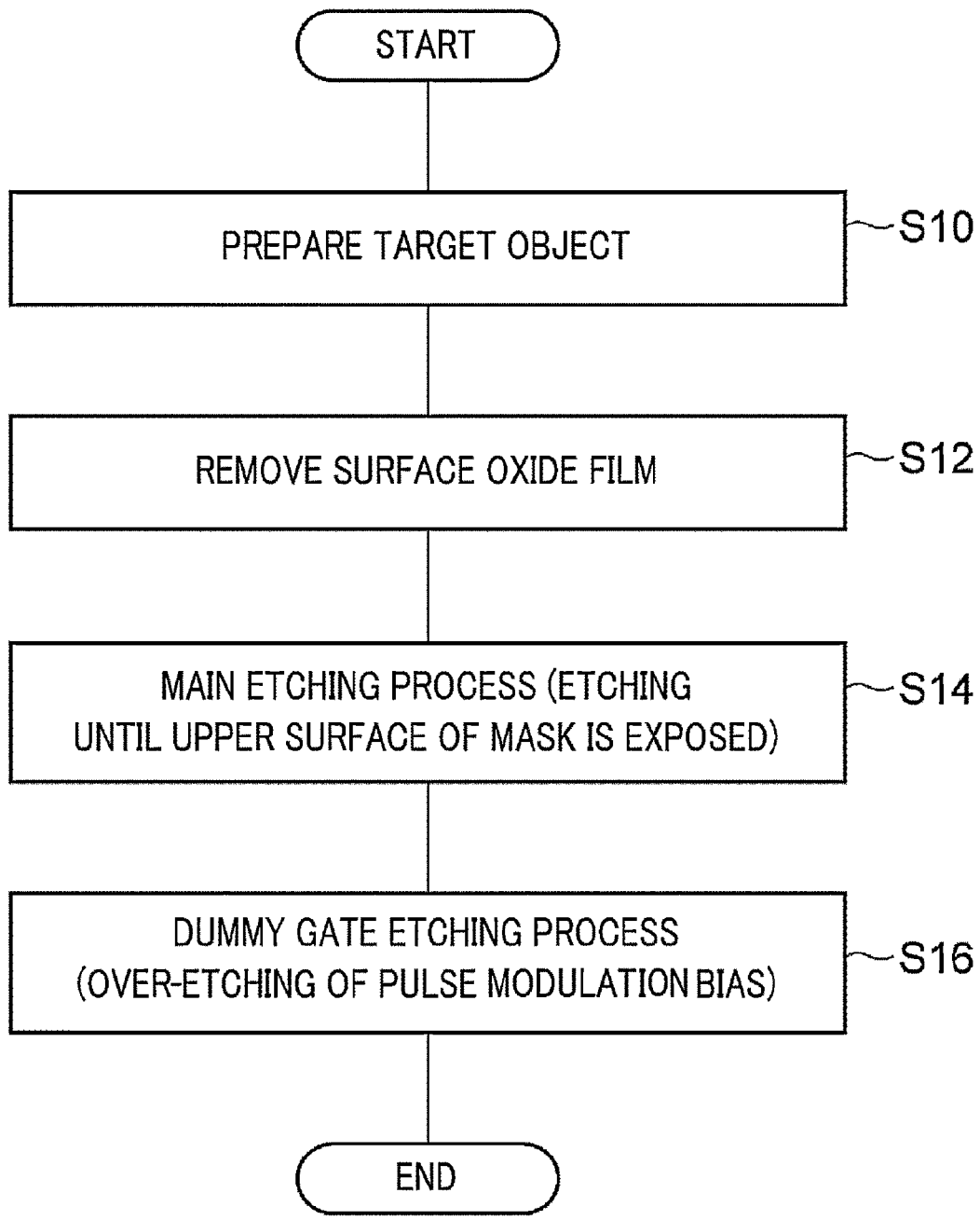

FIG. 15

| FREQUENCY | DUTY RATIO OF 25% (ON/OFF) | DUTY RATIO OF 50% (ON/OFF) | DUTY RATIO OF 75% (ON/OFF) |
|---|---|---|---|
| 10Hz | 25ms/75ms | 50ms/50ms | 75ms/25ms |
| 50Hz | 5ms/15ms | 10ms/10ms | 15ms/5ms |
| 100Hz | 2.5ms/7.5ms | 5ms/5ms | 7.5ms/2.5ms |
| 200Hz | 1.25ms/3.75ms | 2.5ms/2.5ms | 3.75ms/1.25ms |
| 500Hz | 0.5ms/1.5ms | 1ms/1ms | 1.5ms/0.5ms |

ETCHING METHOD

CROSS-REFERENCE TO RELATED APPLICATION

This application claims the benefit of Japanese Patent Application No. 2013-167515 filed on Aug. 12, 2013, the disclosures of which are incorporated herein by reference.

TECHNICAL FIELD

The embodiments described herein pertain generally to an etching method.

BACKGROUND

In a manufacturing process of a semiconductor device, some of multiple regions formed of different semiconductor materials are selectively etched (see, for example, Patent Documents 1 and 2).

Patent Document 1 describes a method of plasma etching an etching target layer of a target object with a patterning mask of the target object. In this method, an etching process is carried out by cyclically switching an ON-state and an OFF-state of plasma power from each other and applying pulsed-bias power, which is synchronized with a cycle of the plasma power, to a mounting table. When the plasma power is in the ON-state and the bias power is in the ON-state, a reaction region is etched and reaction by-products are formed in the reaction region. When the plasma power is in the OFF-state and the bias power is in the OFF-state, the reaction by-products are removed from the reaction region. Thus, an etching rate becomes uniform regardless of a density of a device structure. Further, in Patent Document 1, it is described that if a single cycle is comprised of a successive ON-state and a successive OFF-state, a ratio of the ON-state to the single cycle may be in a range of 5% to 95% or 65% to 75%.

Furthermore, Patent Document 1 describes a method of combining a process of etching by continuously supplying plasma power with a process of etching by supplying pulsed-plasma power and pulsed-bias power. It is described that in the process of etching by continuously supplying plasma power, electron cyclotron resonance plasma, helicon wave plasma, inductively coupled plasma, or surface wave plasma is used as a plasma source.

Patent Document 2 describes a method of plasma etching an etching target layer of a target object with a patterning mask of the target object. It is described that microwave plasma is used as a plasma source and plasma damage to the target object is suppressed by performing a process with plasma under a relatively low electron temperature and a relatively high electron density.

In the method of Patent Document 2, bias power to be supplied to the target object via a mounting table is intermittently supplied by repeating a supply and a stop of the supply of the bias power. Further, Patent Document 2 describes conditions of a frequency and a duty ratio of the bias power intermittently to be supplied. Herein, assuming that a sum of a supply time of AC bias power and a stop time thereof is a total time, the duty ratio refers to a ratio of the supply time to the total time. In Patent Document 2, it is described that since the duty ratio is set to be higher than 0.5 and lower than 1, it is possible to accurately etch the target object into a desired shape. To be specific, it is described that since a thickness and a hardness of a protective film (reaction by-products) formed on a mask layer are higher than those of a protective film (by-products) formed on a bottom wall of a groove, it is possible to vertically etch the target object. Further, it is described that since the frequency of the bias power is in a range of 10 Hz to 30 Hz, an etching rate can be more uniform regardless of a width of a gap between masks.

Patent Document 1: Specification of U.S. Pat. No. 7,718,538
Patent Document 2: Japanese Patent Laid-open Publication No. 2012-084872

However, a conventional etching method needs to be improved in order to achieve miniaturization accompanied with reduction in size of semiconductor devices. By way of example, in a recently employed fin-type field effect transistor, a gate material formed between protruding fins needs to be etched with a mask formed on the fin. Since the fin has a very fine structure, it is required to further improve etching accuracy as well as secure selectivity.

SUMMARY

In one example embodiment, an etching method is to form a dummy gate of a fin-type field effect transistor with a target object. The target object includes multiple fins, masks formed on the multiple fins, and a gate material deposited between the multiple fins. The etching method includes a first etching process of etching the gate material until upper surfaces of the masks are exposed; and a second etching process of etching the gate material deposited between the multiple fins by using surface wave plasma. Here, a pressure in the second etching process is 50 mTorr (6.67 Pa) or more, and in the second etching process, a frequency of a power to be applied to a mounting table configured to mount thereon the target object is in a range of 10 Hz or more to 200 Hz or less, and the power is pulse-modulated such that a duty ratio as a ratio of an ON-time to a pulse cycle is 50% or less.

In this method, in the second etching process of etching the gate material between the fins which is required in the microprocessing, the surface wave plasma is used. Since the surface wave plasma is used, plasma can be generated even at a high pressure of 50 mTorr (6.67 Pa) or higher. Further, by setting the pressure to be 50 mTorr (6.67 Pa) or higher, ions can be collided with neutral particles at least once within a sheath to lose their energy. That is, under a high pressure condition, it is possible to carry out micro-soft etching that does not cause damage to a sample. Thus, it is possible to improve selectivity of the mask and the gate material. Further, since the surface wave plasma having a lower electron temperature than other plasma sources is used, by-products do not adhere to the target object and can be exhausted. Thus, an effect of the by-products can be reduced. Furthermore, since the power to be applied to the mounting table is pulse-modulated, a surface of the target object is re-oxidized during an OFF-time of a pulse, so that it is possible to improve selectivity of the mask and the gate material. In particular, by setting a frequency of the power to be in the range of 10 Hz or more to 200 Hz or less and by pulse-modulating the bias power such that the duty ratio can be 50% or less, it is possible to obtain a time for exhausting the by-products. For this reason, it is possible to suppress adhesion of the by-products to a sidewall. Moreover, since the by-products are sufficiently exhausted, it is possible to suppress obstruction of etching caused by the by-products remaining between the fins. Therefore, it is possible to improve verticality of etching profile as well as secure selectivity.

In the first etching process, the gate material may be etched without pulse-modulating the power to be applied to the mounting table. Therefore, before the gate material between the fins is etched, an etching process may be performed under a different processing condition from a processing condition where the selectivity and the shape can be improved. As such, it is possible to set a processing condition depending on a structure of the target object.

The first etching process and the second etching process may be consecutively carried out in the same processing chamber by using the surface wave plasma. With this configuration, it is possible to form the dummy gate of the fin-type field effect transistor while securing a throughput.

As explained above, in accordance with the various aspects and example embodiments, it is possible to improve etching accuracy as well as secure selectivity when forming a dummy gate of a fin-type field effect transistor.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 9 illustrates an etching method in accordance with the example embodiment;

FIG. 15 shows a processing condition of an experimental example;

DETAILED DESCRIPTION

Figure 1:
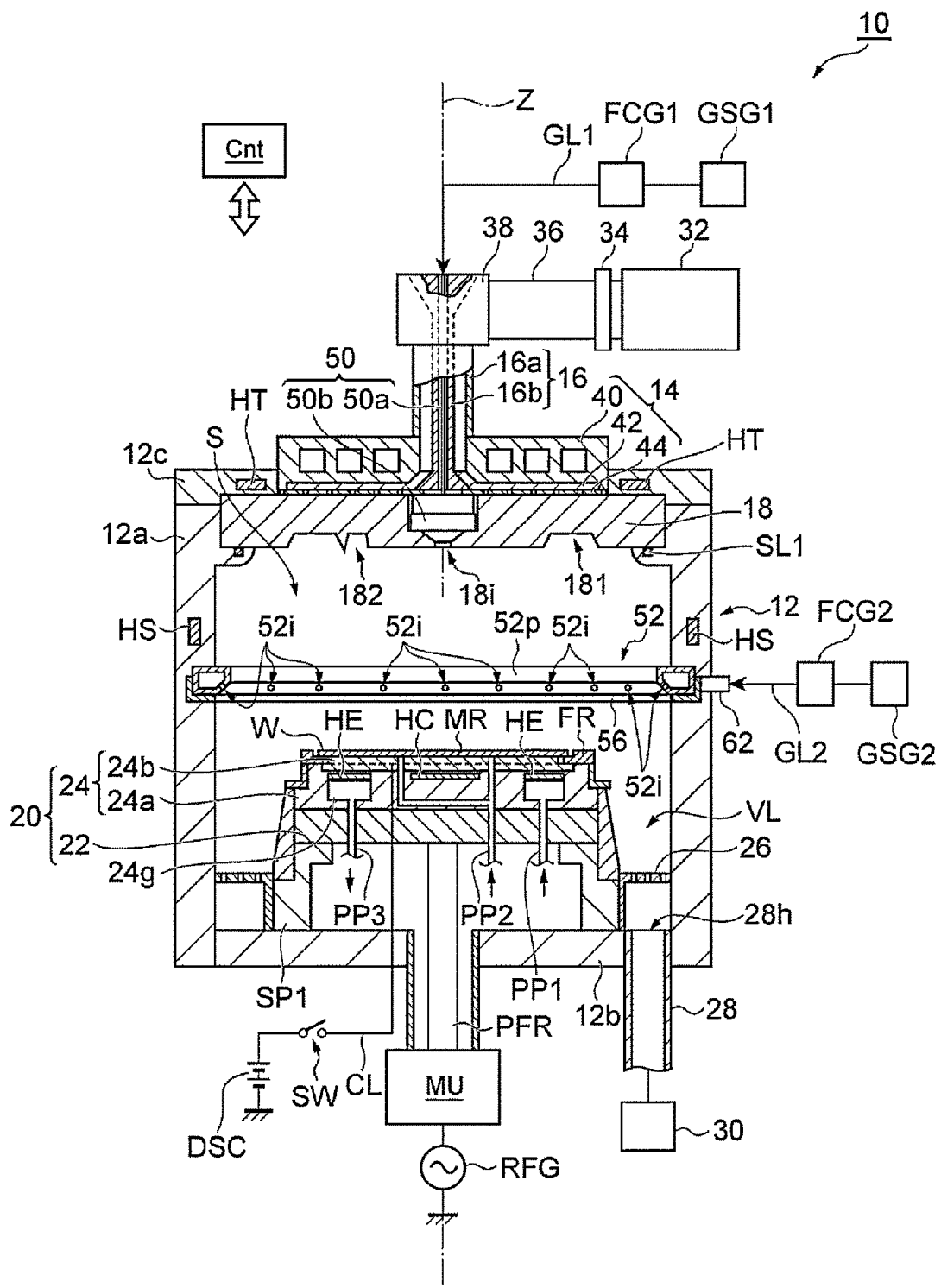
FIG. 1 is a schematic cross-sectional view of a plasma processing apparatus used in an etching method in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, an example of a plasma processing apparatus which can be used in an etching method in accordance with an example embodiment will be explained. FIG. 1 is a schematic cross-sectional view of a plasma processing apparatus.

A plasma processing apparatus 10 illustrated in FIG. 1 includes a processing chamber 12. In the processing chamber 12, a processing space S for accommodating the target object (wafer) W is formed. The processing chamber 12 may include a sidewall 12a, a bottom portion 12b, and a ceiling portion 12c.

The sidewall 12a has a substantially cylindrical shape extending in a direction in which an axis line Z extends (hereinafter, referred to as "axis line Z direction"). An inner diameter of the sidewall 12a is, for example, about 540 mm. The bottom portion 12b is provided at a lower end side of the sidewall 12a. An upper end of the sidewall 12a has an opening. The opening of the upper end of the sidewall 12a is closed by a dielectric window 18. The dielectric window 18 is held between the upper end of the sidewall 12a and the ceiling portion 12c. Between the dielectric window 18 and the upper end of the sidewall 12a, a sealing member SL1 may be interposed. The sealing member SL1 is, for example, an O-ring and configured to seal the processing chamber 12.

The plasma processing apparatus 10 further includes a mounting table 20. The mounting table 20 is provided under the dielectric window 18 within the processing chamber 12. The mounting table 20 includes a plate 22 and an electrostatic chuck 24.

The plate 22 is a metallic member having a substantial disc shape and formed of, for example, aluminum. The plate 22 is supported by a cylindrical supporting member SP1. The supporting member SP1 extends vertically upwards from the bottom portion 12b. The plate 22 serves as a high frequency electrode. The plate 22 is electrically connected to a high frequency power supply RFG, which generates a high frequency bias power, via a matching unit MU and a power supply rod PFR. The high frequency power supply RFG outputs a high frequency bias power having a certain frequency of, for example, 10 Hz to 300 Hz, 10 Hz to 200 Hz, or 10 Hz to 100 Hz suitable for controlling energy of ions attracted to the target object W. Further, the high frequency power supply RFG is configured to output a pulse-modulated bias power by repeating ON and OFF of an output of power. The matching unit MU accommodates a matching device configured to match impedance on the side of the high frequency power supply RFG with load impedance such as mainly an electrode, plasma, and the processing chamber 12. Within the matching device, a blocking capacitor for generating self-bias is included.

At an upper surface of the plate 22, the electrostatic chuck 24 is provided. The electrostatic chuck 24 includes a base plate 24a and a chuck portion 24b. The base plate 24a is a metallic member having a substantial disc shape and formed of, for example, aluminum. The base plate 24a is provided on the plate 22. At an upper surface of the base plate 24a, the chuck portion 24b is provided. An upper surface of the chuck portion 24b serves as a mounting region MR on which the target object W is mounted. The chuck portion 24b is configured to hold the target object W with an electrostatic adsorptive force. The chuck portion 24b includes an electrode film interposed between dielectric films. The electrode film of the chuck portion 24b is electrically connected to a DC power supply DSC via a switch SW and a coated line CL. The chuck portion 24b attracts and holds the target object W on an upper surface thereof with a Coulomb force generated by a DC voltage applied from the DC power supply DSC. A focus ring FR is provided diametrically outside the chuck portion 24b to surround an edge of the target object W.

Within the base plate 24a, an annular coolant path 24g extending along the circumferential thereof is provided. A coolant, for example, cooling water, having a certain temperature is supplied from a chiller unit through pipes PP1 and PP3 to be circulated through the coolant path 24g. A process temperature of the target object W on the chuck portion 24b can be controlled by a temperature of the coolant. Further, a heat transfer gas, for example, a He gas, is supplied between the upper surface of the chuck portion 24b and a rear surface of the target object W from a heat transfer gas supply unit through a supply pipe PP2.

Around the mounting table 20, an annular exhaust path VL is formed. At a portion of the exhaust path VL in the axis line Z direction, an annular baffle plate 26 including multiple through holes is provided. The exhaust path VL is connected to an exhaust line 28 having an exhaust opening 28h. The exhaust line 28 is provided at the bottom portion 12b of the processing chamber 12. The exhaust line 28 is connected to an exhaust device 30. The exhaust device 30 includes a pressure controller and a vacuum pump such as a turbo molecular pump. The processing space S within the processing chamber 12 can be depressurized to a desired vacuum level by the exhaust device 30. Further, a gas can be exhausted from an outer periphery of the mounting table 20 through the exhaust path VL by operating the exhaust device 30.

Further, the plasma processing apparatus 10 may further include heaters HT, HS, HC, and HE as temperature controllers. The heater HT is provided within the ceiling portion 12c and annularly extends to surround an antenna 14. Further, the heater HS is provided within the sidewall 12a and annularly extends. The heater HC is provided within the base plate 24a. The heater HC is provided under a central portion of the mounting region MR, i.e., at a region through which the axis line Z is passed, within the base plate 24a. Furthermore, the heater HE is provided within the base plate 24a and annularly extends to surround the heater HC. The heater HE is provided under an outer periphery portion of the mounting portion MR.

Further, the plasma processing apparatus 10 may further include the antenna 14, a coaxial waveguide 16, the dielectric window 18, a microwave generator 32, a tuner 34, a waveguide 36, and a mode converter 38. The microwave generator 32 is configured to generate a microwave having a frequency of, for example, 2.45 GHz. The microwave generator 32 is connected to an upper portion of the coaxial waveguide 16 via the tuner 34, the waveguide 36 and the mode converter 38. A central axis line of the coaxial waveguide 16 is the axis line Z and extends along the axis line Z. In the example embodiment, a center of the mounting region MR of the mounting table 20 is positioned on the axis line Z.

The coaxial waveguide 16 includes an external conductor 16a and an internal conductor 16b. The external conductor 16a has a cylindrical shape extending along the axis line Z. A lower end of the external conductor 16a may be electrically connected to an upper portion of a cooling jacket 40 including a conductive surface. The internal conductor 16b is provided inside the external conductor 16a to be coaxial with the external conductor 16a. The internal conductor 16b has a cylindrical shape extending along the axis line Z. A lower end of the internal conductor 16b is connected to a slot plate 44 of the antenna 14.

In the example embodiment, the antenna 14 is a radial line slot antenna. The antenna 14 is positioned within the opening formed at the ceiling portion 12c and is also provided on an upper surface of the dielectric window 18. The antenna 14 includes a dielectric plate 42 and the slot plate 44. The dielectric plate 42 is configured to shorten a wavelength of a microwave and has a substantial disc shape. The dielectric plate 42 is formed of, for example, quartz or alumina. The dielectric plate 42 is held between the slot plate 44 and a lower surface of the cooling jacket 40. Therefore, the antenna 14 may include the dielectric plate 42, the slot plate 44, and the lower surface of the cooling jacket 40.

Figure 2:
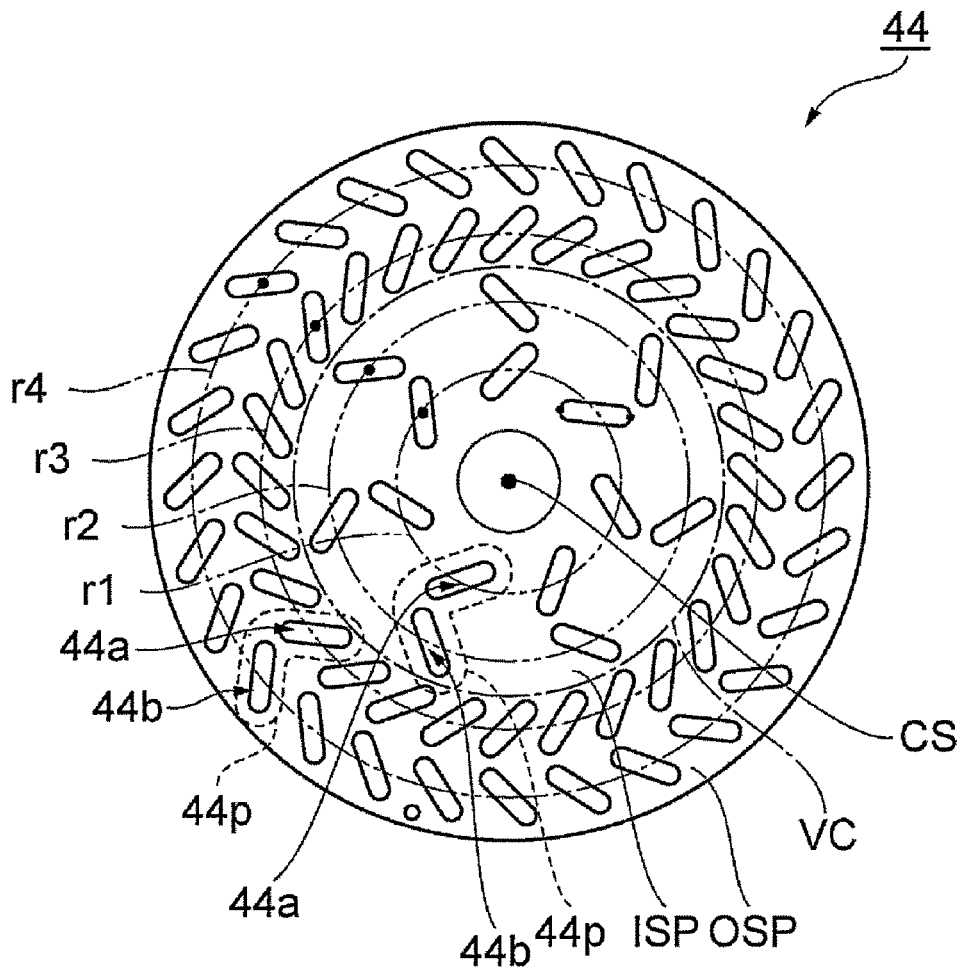
FIG. 2 is a plane view illustrating an example of a slot plate.

FIG. 2 is a plane view illustrating an example of the slot plate. The slot plate 44 has a thin plate shape and disc shape. Both surfaces of the slot plate 44 in a plate thickness direction are flat. A center CS of the circular slot plate 44 is positioned on the axis line Z. The slot plate 44 includes multiple slot pairs 44p. Each of the slot pairs 44p includes two slot holes 44a and 44b penetrating through the slot plate 44 in the thickness direction thereof. Each of the slot holes 44a and 44b has an elongated hole shape when viewed from the plane. In each of the slot pairs 44p, a direction in which a major axis of the slot hole 44a extends and a direction in which a major axis of the slot hole 44b extends are intersected with each other or orthogonal to each other.

In the example embodiment as illustrated in FIG. 2, the multiple slot pairs 44p are divided into an inner slot pair group ISP arranged inside a virtual circle VC around the axis line Z and an outer slot pair group OSP arranged outside the virtual circle VC. The inner slot pair group ISP includes multiple slot pairs 44p. In the example embodiment as illustrated in FIG. 2, the inner slot pair group ISP includes seven slot pairs 44p. The multiple slot pairs 44p belonging to the inner slot pair group ISP are equally spaced in a circumferential direction with respect to the center CS. Further, multiple slot holes 44a belonging to the inner slot pair group ISP are equally spaced such that the centers of the slot holes 44a are positioned on a circle having a radius r1 from the center CS of the slot plate 44. Further, multiple slot holes 44b belonging to the inner slot pair group ISP are equally spaced such that centers of the slot holes 44b are positioned on a circle having a radius r2 from the center CS of the slot plate 44. Herein, the radius r2 is greater than the radius r1.

The outer slot pair group OSP includes multiple slot pairs 44p. In the example embodiment as illustrated in FIG. 2, the outer slot pair group OSP includes twenty eight slot pairs 44p. The multiple slot pairs 44p belonging to the outer slot pair group OSP are equally spaced in the circumferential direction with respect to the center CS. Further, multiple slot holes 44a belonging to the outer slot pair group OSP are equally spaced such that the centers of the slot holes 44a are positioned on a circle having a radius r3 from the center CS of the slot plate 44. Further, multiple slot holes 44b belonging to the outer slot pair group OSP are equally spaced such that the centers of the slot holes 44b are positioned on a circle having a radius r4 from the center CS of the slot plate 44. Herein, the radius r3 is greater than the radius r2, and the radius r4 is greater than the radius r3.

Further, each slot hole 44a belonging to the inner slot pair group ISP and the outer slot pair group OSP is arranged such that a long side thereof has the same angle with respect to a line segment connecting the center CS and a center of each slot hole 44a. Furthermore, each slot hole 44b belonging to the inner slot pair group ISP and the outer slot pair group OSP is arranged such that the long side thereof has the same angle with respect to a line segment connecting the center CS and a center of each slot hole 44b.

Figure 3:
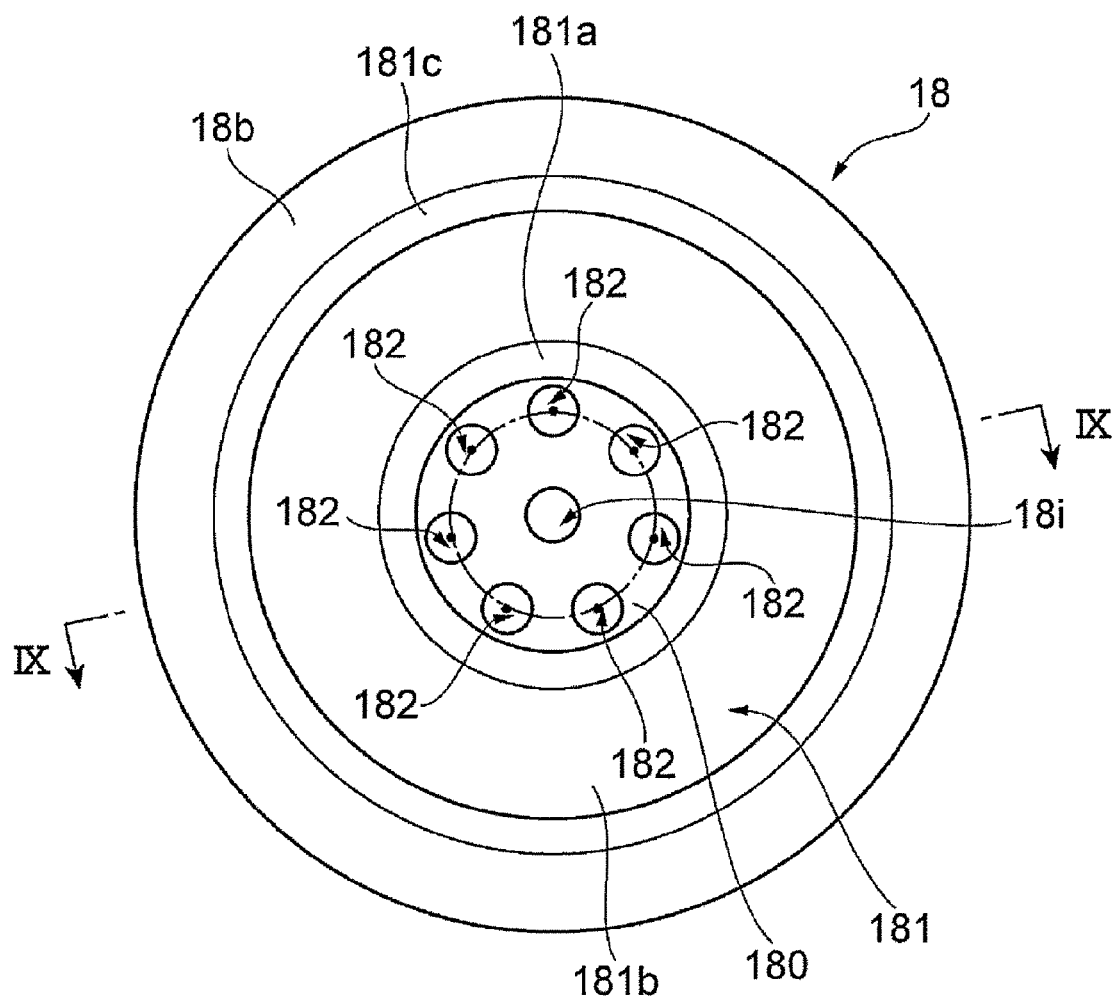
FIG. 3 is a plane view illustrating an example of a dielectric window.
Figure 4:
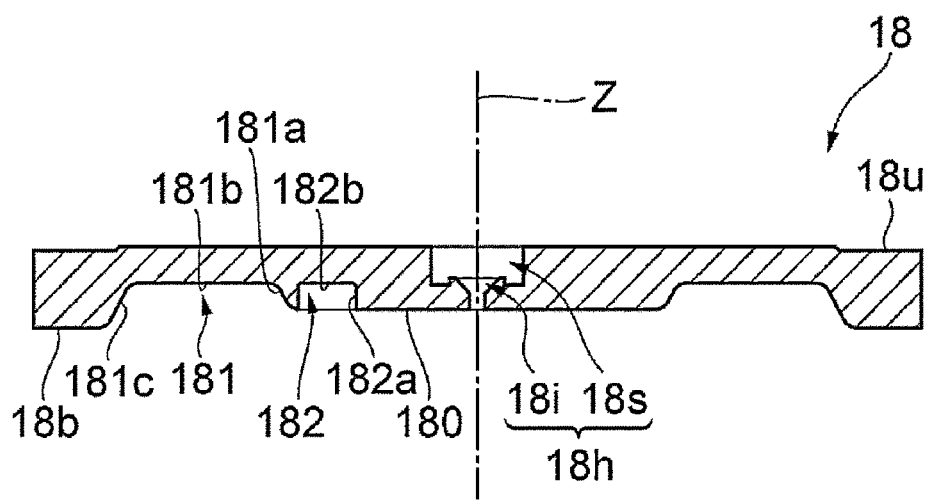
FIG. 4 is a cross-sectional view taken along a line IX-IX of FIG. 3.

FIG. 3 is a plane view illustrating an example of the dielectric window, and illustrates a status of the dielectric window when viewed from the processing space S. FIG. 4 is a cross-sectional view taken along a line IX-IX of FIG. 3. The dielectric window 18 has a substantial disc shape and is formed of a dielectric material such as quartz or alumina. On an upper surface 18u of the dielectric window 18, the slot plate 44 is provided.

A through hole 18h is formed at a central portion of the dielectric window 18. An upper portion of the through hole 18h serves as a space 18s for accommodating an injector 50b of a central inlet unit 50 to be described later, and a lower portion thereof serves as a central inlet opening 18i of the central inlet unit 50 to be described later. Further, a central axis line of the dielectric window 18 is identical with the axis line Z.

An opposite surface to the upper surface 18u of the dielectric window 18, i.e, a lower surface 18b of the dielectric window 18 is in contact with the processing space S and plasma is generated at the side of the lower surface 18b. In the lower surface 18b, various shapes are formed. To be specific, the lower surface 18b includes a planar surface 180 at a central portion surrounding the central inlet opening 18i. The planar surface 180 is a flat surface orthogonal to the axis line Z. In the lower surface 18b, a first recess portion 181 is annularly and continuously formed such that a sidewall thereof tapers upwardly in the thickness direction of the dielectric window 18.

The first recess portion 181 includes an inner tapered surface 181a, a bottom surface 181b, and an outer tapered surface 181c. The bottom surface 181b is formed at the side of the upper surface 18u rather than at the planar surface 180, and annularly extends in parallel with the planar surface 180. The inner tapered surface 181a annularly extends between the planar surface 180 and the bottom surface 181b, and is inclined with respect to the planar surface 180. Further, a periphery of the lower surface 18b is a surface in contact with the sidewall 12a.

Further, in the lower surface 18b, multiple second recess portions 182 are formed to be upwardly recessed in the plate thickness direction from the planar surface 180. The number of the multiple second recess portions 182 is seven in the example embodiment as illustrated in FIG. 3 and FIG. 4. These multiple second recess portions 182 are equally spaced along the circumferential direction thereof. Further, each of the multiple second recess portions 182 has a circular shape when viewed from the plane on a surface orthogonal to the axis line Z. To be specific, an inner surface 182a of the second recess portion 182 is a cylindrical surface extending in the axis line Z direction. Further, a bottom surface 182b of the second recess portion 182 is formed at the side of the upper surface 18u rather than at the planar surface 180, and is a circular surface parallel with the planar surface 180.

Figure 5:
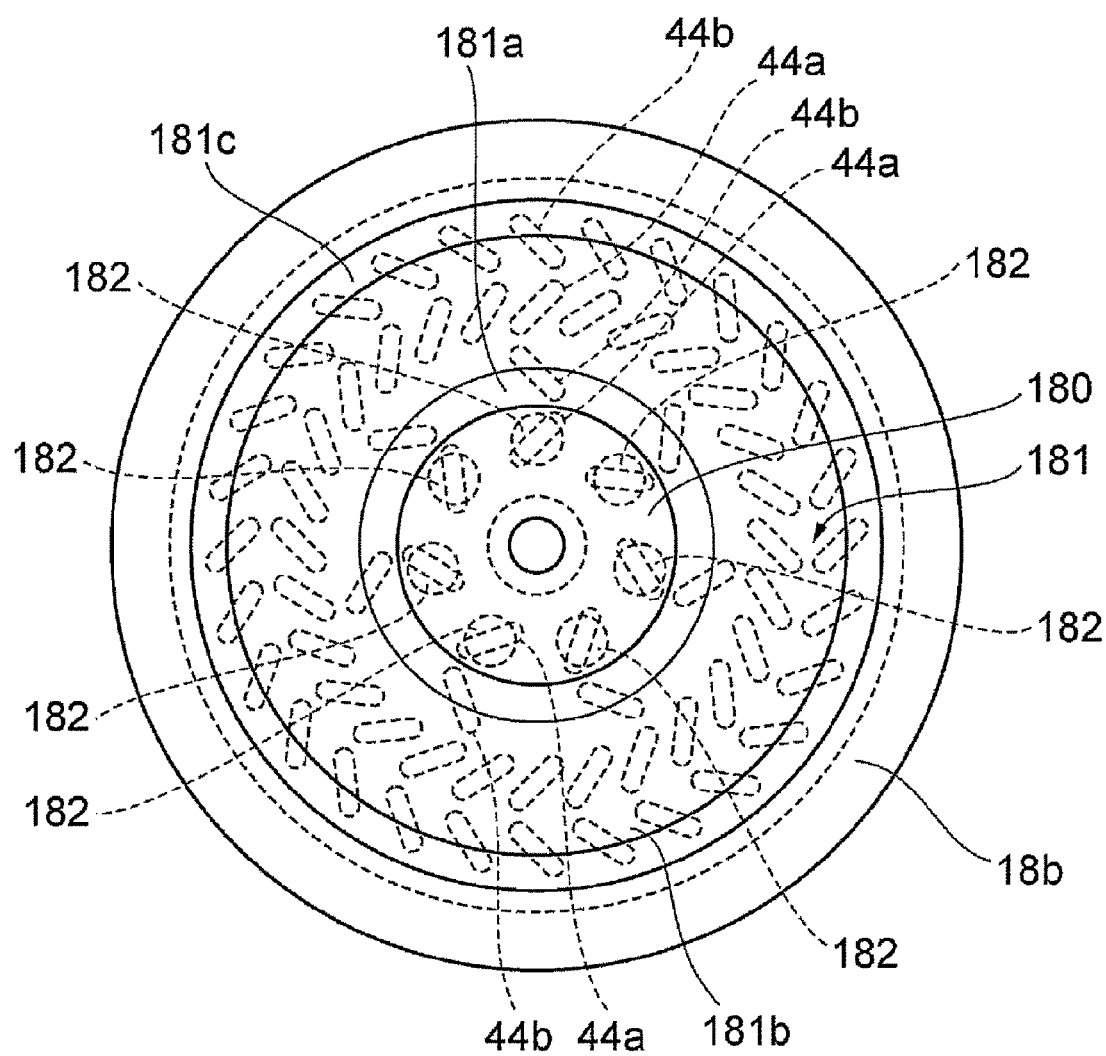
FIG. 5 is a plane view illustrating a status where the slot plate illustrated in FIG. 2 is provided on the dielectric window illustrated in FIG. 3.

FIG. 5 is a plane view illustrating a status where the slot plate illustrated in FIG. 2 is provided on the dielectric window illustrated in FIG. 3, and illustrates a status of the dielectric window 18 when viewed from the bottom. As illustrated in FIG. 5, when viewed from the plane, i.e., when viewed from the axis line Z direction, the multiple slot holes 44a and the multiple slot holes 44b belonging to the outer slot pair group OSP, and the multiple slot holes 44b belonging to the inner slot pair group ISP are overlapped with the first recess portion 181. To be specific, when viewed from the plane, a part of each slot hole 44b belonging to the outer slot pair group OSP is overlapped with the outer tapered surface 181c, and the other part thereof is overlapped with the bottom surface 181b. Furthermore, when viewed from the plane, the multiple slot holes 44a belonging to the outer slot pair group OSP are overlapped with the bottom surface 181b. Moreover, when viewed from the plane, a part of each slot hole 44b belonging to the inner slot pair group ISP is overlapped with the inner tapered surface 181a, and the other part thereof is overlapped with the bottom surface 181b.

Further, when viewed from the plane, i.e., when viewed from the axis line Z direction, each of the multiple slot holes 44a belonging to the inner slot pair group ISP is overlapped with each of the second recess portion 182. To be specific, when viewed from the plane, the center of the bottom surface of each second recess portion 182 is positioned within each slot hole 44a belonging to the inner slot pair group ISP.

Referring to FIG. 1 again, in the plasma processing apparatus 10, a microwave generated by the microwave generator 32 is propagated to the dielectric plate 42 through the coaxial waveguide 16, and is applied to the dielectric window 18 from the slot holes 44a and 44b of the slot plate 44.

In the dielectric window 18, as described above, a plate thickness of a portion where the first recess portion 181 is formed and a plate thickness of a portion where the second recess portion 182 is formed are smaller than a plate thickness of the other portions. Therefore, in the dielectric window 18, a microwave transmittance becomes higher at the portions where the first recess portion 181 and the second recess portion 182 are formed. Further, when viewed from the axis line Z direction, the slot holes 44a and 44b belonging to the outer slot pair group OSP and the slot holes 44b belonging to the inner slot pair group ISP are overlapped with the first recess portion 181, and each of the slot holes 44a belonging to the inner slot pair group ISP is overlapped with each of the second recess portion 182. Therefore, electric fields of the microwave are concentrated on the first recess portion 181 and the second recess portion 182, so that the microwave energy is concentrated on the first recess portion 181 and the second recess portion 182. As a result, it is possible to stably generate plasma at the first recess portion 181 and the second recess portion 182, and also possible to allow plasma right under the dielectric window 18 to be stably distributed in the diametrical direction and the circumferential direction.

Further, the plasma processing apparatus 10 includes the central inlet unit 50 and a peripheral inlet unit 52. The central inlet unit 50 includes a pipe 50a, the injector 50b, and the central inlet opening 18i. The pipe 50a passes through an inner hole of the internal conductor 16b of the coaxial waveguide 16. Further, an end of the pipe 50a extends to the inside of the space 18s (see FIG. 4) of the dielectric window 18 along the axis line Z. Within the space 18s and under the end of the pipe 50a, the injector 50b is provided. The injector 50b includes multiple through holes extending in the axis line Z direction. Further, in the dielectric window 18, the central inlet opening 18i is formed. The central inlet opening 18i is continuously formed under the space 18s and extends along the axis line Z. The central inlet unit 50 described above is configured to supply a gas to the injector 50b through the pipe 50a and discharges the gas from the injector 50b through the central inlet opening 18i. As such, the central inlet unit 50 discharges the gas toward right under the dielectric window 18 along the axis line Z. That is, the central inlet unit 50 introduces the gas to a plasma generation region having a high electron temperature.

The peripheral inlet unit 52 includes multiple peripheral inlet openings 52i. The multiple peripheral inlet openings 52i mainly supply a gas toward an edge portion of the target object W. The multiple peripheral inlet openings 52i are oriented to the edge portion of the target object W or a periphery portion of the mounting region MR. The multiple peripheral inlet openings 52i are arranged along the circumferential direction between the central inlet opening 18i and the mounting table 20. That is, the multiple peripheral inlet openings 52i are annularly arranged around the axis line Z at a region (plasma diffusion region) having a lower electron temperature than right under the dielectric window. The peripheral inlet unit 52 supplies a gas toward the target object W from a region having a low electron temperature. Therefore, it is possible to allow a dissociation degree of the gas introduced into the processing space S from the peripheral inlet unit 52 to be lower than a dissociation degree of the gas introduced into the processing space S from the central inlet unit 50.

Figure 6:
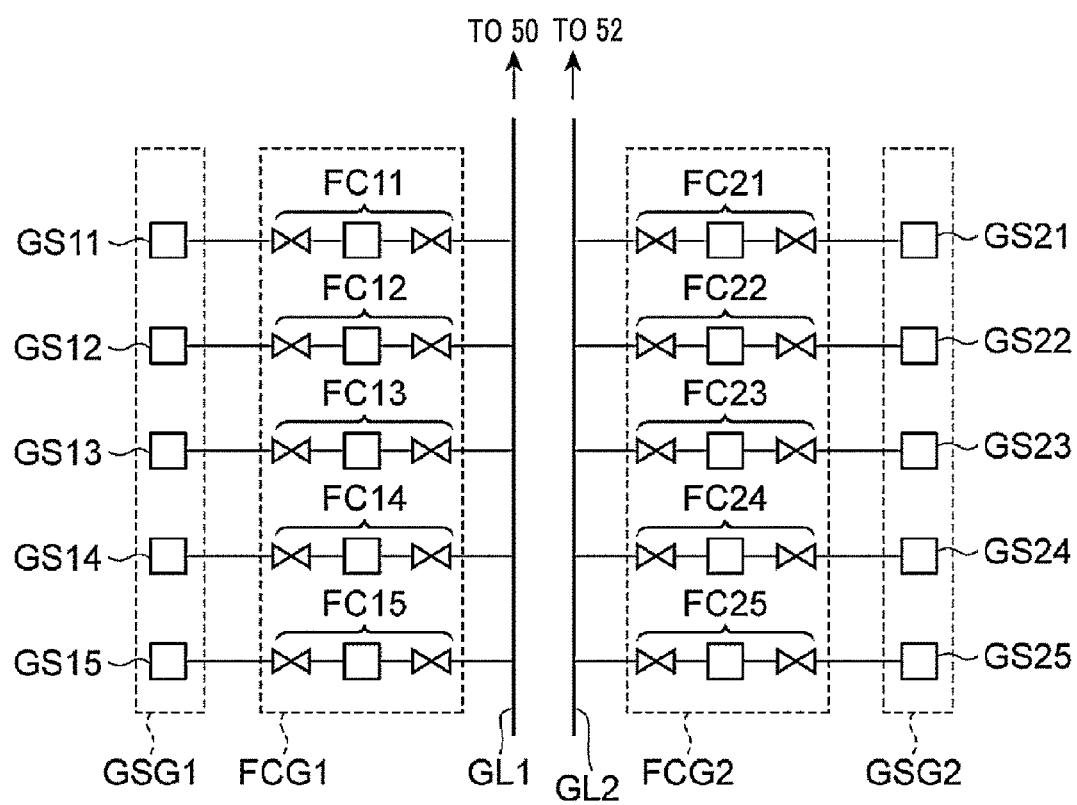
FIG. 6 illustrates a gas supply system including a first flow rate control unit group, a first gas source group, a second flow rate control unit group, and a second gas source group.

The central inlet unit 50 is connected to a first gas source group GSG1 via a first flow rate control unit group FCG1. Further, the peripheral inlet unit 52 is connected to a second gas source group GSG2 via a second flow rate control unit group FCG2. FIG. 6 illustrates a gas supply system including the first flow rate control unit group, the first gas source group, the second flow rate control unit group, and the second gas source group. As illustrated in FIG. 6, the first gas source group GSG1 includes multiple first gas sources GS11 to GS15. The first gas sources GS11 to GS15 are an Ar gas source, a He gas source, a $Cl_2$ gas source, a HBr gas source, and an $O_2$ gas source, respectively. The first gas source group GSG1 may further include a gas source different from these gas sources.

The first flow rate control unit group FCG1 includes multiple first flow rate control units FC11 to FC15. Each of the multiple first flow rate control units FC11 to FC15 includes, for example, two valves and a flow rate controller provided between the two valves. The flow rate controller is, for example, a mass flow controller. The multiple first gas sources GS11 to GS15 are connected to a common gas line GL1 via the multiple first flow rate control units FC11 to FC15, respectively. The common gas supply line GL1 is connected to the central inlet unit 50.

The second gas source group GSG2 includes multiple second gas sources GS21 to GS25. The second gas sources GS21 to GS25 are an Ar gas source, a He gas source, a $Cl_2$ gas source, a HBr gas source, and an $O_2$ gas source, respectively. The second gas source group GSG2 may further include a gas source different from these gas sources.

The second flow rate control unit group FCG2 includes multiple second flow rate control units FC21 to FC25. Each of the multiple second flow rate control units FC21 to FC25 includes, for example, two valves and a flow rate controller provided between the two valves. The flow rate controller is, for example, a mass flow controller. The multiple second gas sources GS21 to GS25 are connected to a common gas line GL2 via the multiple second flow rate control units FC21 to FC25, respectively. The common gas line GL2 is connected to the peripheral inlet unit 52.

As such, in the plasma processing apparatus 10, the multiple first gas sources and the multiple first flow rate control units are provided only for the central inlet unit 50. Further, the multiple second gas sources and the multiple second flow rate control units, which are independent of these multiple first gas sources and multiple first flow rate control units, are provided only for the peripheral inlet unit 52. Therefore, it is possible to independently control a kind of a gas to be introduced into the processing space S from the central inlet unit 50 and a flow rate of one or more gases to be introduced into the processing space S from the central inlet unit 50, and also possible to independently control a kind of a gas to be introduced into the processing space S from the peripheral inlet unit 52 and a flow rate of one or more gases to be introduced into the processing space S from the peripheral inlet unit 52.

In the example embodiment, the plasma processing apparatus 10 may further include a control unit Cnt as illustrated in FIG. 1. The control unit Cnt may be a control device such as a programmable computer device. The control unit Cnt may control each component of the plasma processing apparatus 10 according to a program based on a recipe. By way of example, the control unit Cnt may transmit control signals to the multiple first flow rate control units FC11 to FC15 to control a kind of a gas and a flow rate of the gas to be supplied to the central inlet unit 50. Further, the control unit Cnt may transmit control signals to the multiple second flow rate control units FC21 to FC25 to control a kind of a gas and a flow rate of the gas to be supplied to the peripheral inlet unit 52. Furthermore, the control unit Cnt may supply control signals to the microwave generator 32, the high frequency power supply RFG, and the exhaust device 30 to control power of a microwave, power and ON/OFF of RF bias, and a pressure within the processing chamber 12. Moreover, the control unit Cnt may transmit a control signal to a heater power supply connected to the heaters HT, HS, HC, and HE to adjust temperatures of these heaters.

Figure 7A:
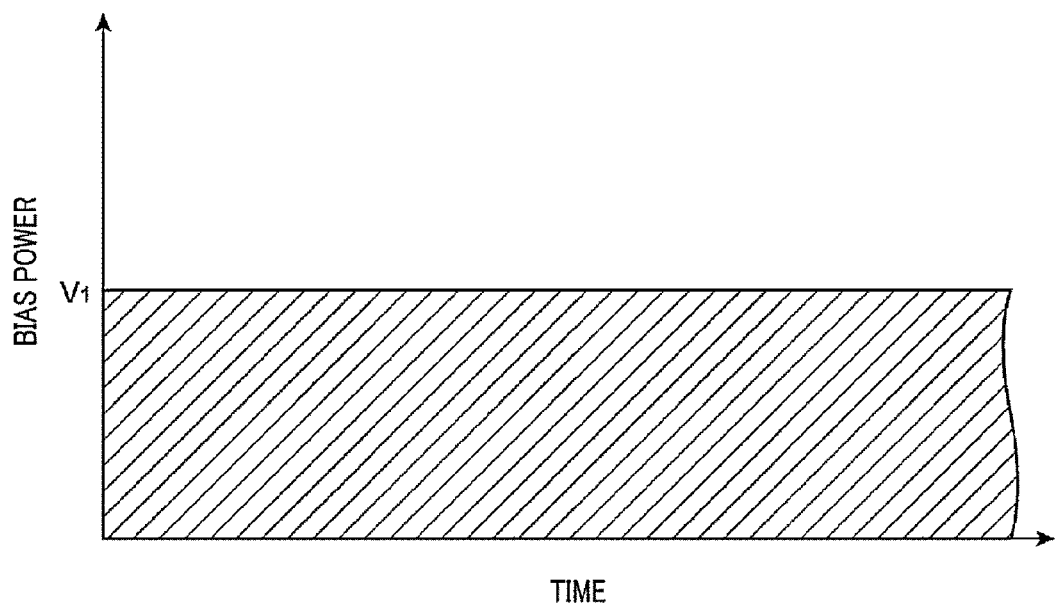
FIG. 7A and FIG. 7B are diagrams showing pulse modulation of bias power.
Figure 7B:
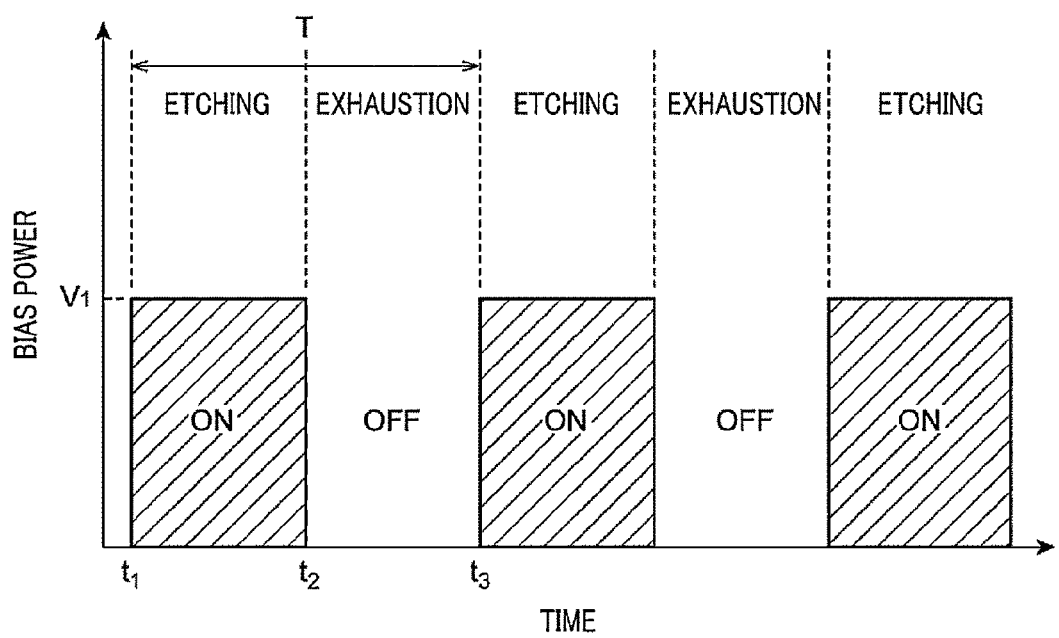

In the example embodiment, the control unit Cnt may generate a pulsed-RF bias power by adjusting an ON/OFF ratio of RF bias power. FIG. 7A and FIG. 7B are diagrams showing pulse modulation of RF bias power. FIG. 7A shows dependency of RF bias power applied continuously on a time. If there is no OFF-time of RF bias power, as shown in FIG. 7A, a constant bias voltage $V_1$ is continuously applied without depending on a time. Meanwhile, FIG. 7B shows dependency of RF bias power applied in a pulse shape on a time. If the power is applied in a pulse shape, as shown in FIG. 7B, a constant bias voltage $V_1$ is applied only during an ON-time between a time $t_1$ to a time $t_2$. That is, only during the ON-time, ions are attracted toward a substrate and the etching process is carried out. Further, during an OFF-time between the time $t_2$ to a time $t_3$, the bias power is zero. That is, during the OFF-time, the etching process is not carried out, and by-products generated by the etching process are exhausted. The RF bias power is pulse-modulated by repeating the ON-time and the OFF-time.

The pulse-modulated bias power has a cycle T including a single ON-time and a single OFF-time subsequent to the ON-time. Herein, a ratio of the ON-time to the cycle T is referred to as a duty ratio. The control unit Cnt may perform a pulse modulation such that the duty ratio can be 50% or less. Further, if the duty ratio is zero, the etching process is not carried out. For this reason, for example, the control unit Cnt may perform the pulse modulation such that the duty ratio can be more than 0%. Otherwise, the control unit Cnt may perform the pulse modulation such that the duty ratio can be in a range of 5% or more to 50% or less. Further, if the duty ratio is 100%, a voltage becomes a continuous bias voltage as shown in FIG. 7A.

Figure 8A:
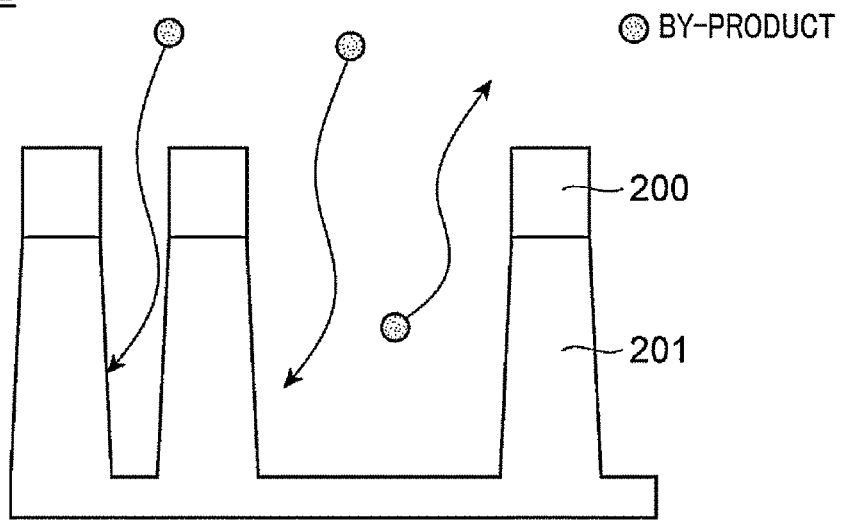
FIG. 8A and FIG. 8B are diagrams illustrating exhaustion of by-products caused by the pulse modulation.
Figure 8B:
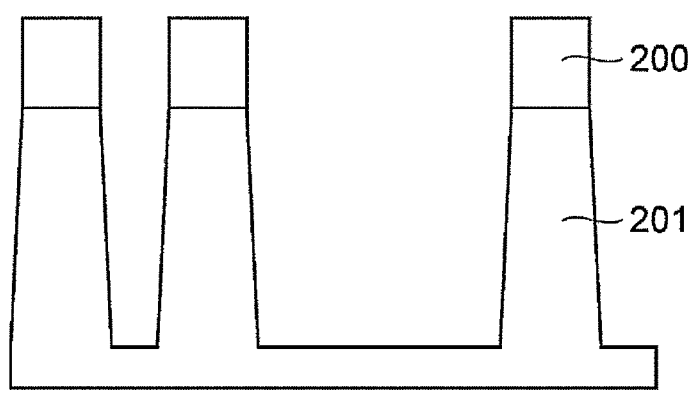

FIG. 8A and FIG. 8B are schematic diagrams illustrating a surface of a target object when the etching is carried out by applying the pulse-modulated bias power. FIG. 8A and FIG. 8B illustrate an example where an etching target layer 201 is etched with a mask 200 formed on the etching target layer 201. FIG. 8A is a diagram showing the surface of the target object during an ON-time. As shown in FIG. 8A, during the ON-time, while ions are attracted toward a side surface of the target object, the etching process is carried out and by-products are generated. Some of the generated by-products may be exhausted. Further, some of the generated by-products may adhere to a sidewall of the etching target layer 201 or may remain between sidewalls of the etching target layer 201. A ratio of the remaining by-products is determined by a balance between generation and exhaustion of the by-products.

FIG. 8B is a diagram illustrating the surface of the target object during an OFF-time. During the OFF-time, the etching is not carried out, so that by-products are not generated. Therefore, during the OFF-time, the by-products generated during the ON-time are exhausted, so that the by-products rarely remain between the sidewalls of the etching target layer 201. As such, since there is an OFF-time, by-products can be exhausted before adhering to the sidewalls of the etching target layer 201, so that it is possible to obtain a desired vertical profile. Further, since the by-products do not remain between the sidewalls of the etching target layer 201, it is possible to suppress obstruction of etching caused by the by-products. Therefore, a desired vertical profile can be obtained. Furthermore, an OFF-time just needs to be set sufficiently to exhaust by-products within a plasma sheath.

Referring to FIG. 1 again, in the example embodiment, the peripheral inlet unit 52 may further include an annular line 52p. This annular line 52p includes multiple peripheral inlet openings 52i. The annular line 52p may be formed of, for example, quartz. As illustrated in FIG. 1, the annular line 52p is provided along an inner wall surface of the sidewall 12a in the example embodiment. In other words, the annular line 52p is not provided on a path connecting a lower surface of the dielectric window 18 with the mounting region MR, i.e., the target object W. Therefore, the annular line 52p does not suppress diffusion of plasma. Further, since the annular line 52p is provided along the inner wall surface of the sidewall 12a, damage of the annular line 52p caused by plasma can be suppressed and a frequency of exchanging the annular line 52p can be reduced. Furthermore, since the annular line 52p is provided along the sidewall 12a of which temperature can be controlled by the heater, it is possible to improve stability of a temperature of a gas to be introduced into the processing space S from the peripheral inlet unit 52.

Further, in the example embodiment, the multiple peripheral inlet openings 52i are directed to the edge portion of the target object W. That is, the multiple peripheral inlet openings 52i are inclined with respect to the flat surface orthogonal to the axis line Z to discharge a gas toward the edge portion of the target object W. Since the peripheral inlet openings 52i are inclined and directed to the edge portion of the target object W as such, active species of the gas discharged from the peripheral inlet openings 52i directly head toward the edge portion of the target object W. Thus, the active species of the gas can be supplied to the edge portion of the target object W without being deactivated. As a result, it is possible to reduce non-uniformity in a processing rate of each portion in a diametrical direction of the target object W.

Hereinafter, an etching method in accordance with the present example embodiment will be explained. FIG. 9 illustrates an etching method of forming a dummy gate of a fin-type field effect transistor using a target object.

Figure 10A:
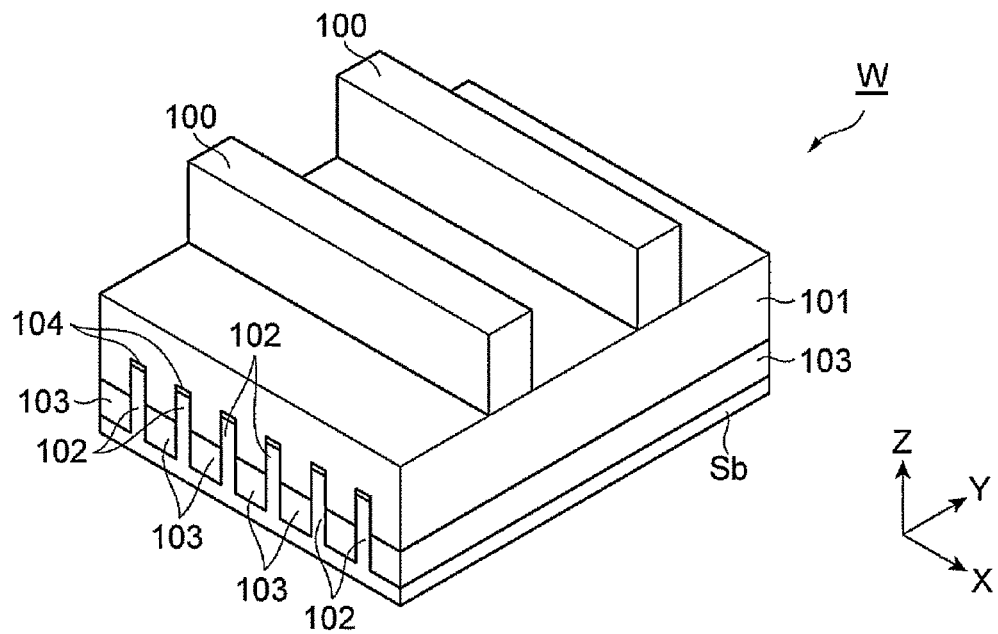
FIG. 10A to FIG. 10C illustrate an example of a fin-type field effect transistor.
Figure 10B:
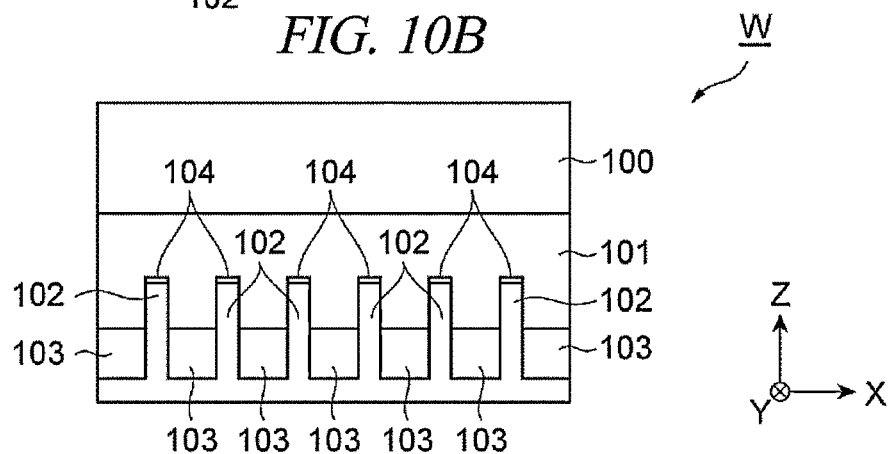
Figure 10C:
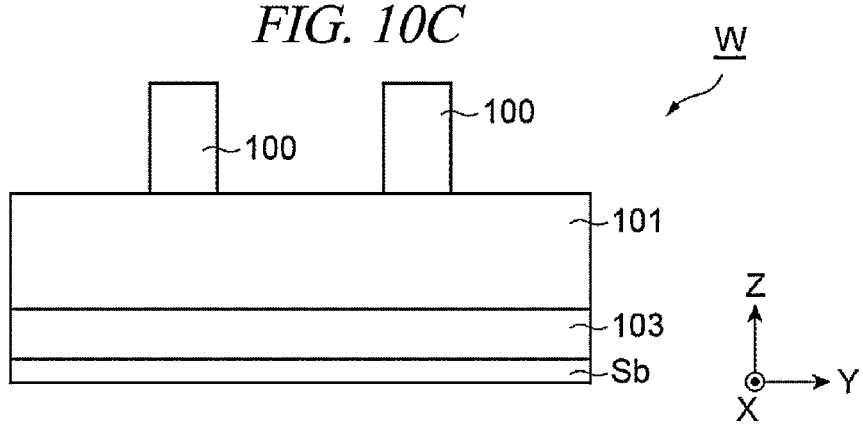

As illustrated in FIG. 9, at block S10 (prepare target object), the control unit Cnt prepares the target object W within the plasma processing apparatus 10 shown in FIG. 1. FIG. 10A to FIG. 10C illustrate an example of the target object W. FIG. 10A is a perspective view of the target object W, FIG. 10B is a side view of the target object W, and FIG. 10C is a front view of the target object W. As shown in FIG. 10A to FIG. 10C, the target object W includes a substrate Sb having a fin structure in which multiple fins 102 are formed. A main surface of the substrate Sb is parallel to an XY-plane, and the multiple fins 102 are extended along a Y-direction. The substrate Sb is made of, for example, Si. On the substrate Sb, for example, a thermal oxide film 103 is formed. Further, masks 104 are respectively formed on upper surfaces of the multiple fins 102. The masks 104 are extended along the Y-direction in the same manner as the fins 102. The masks 104 are formed of oxide films such as $SiO_2$. On the thermal oxide film 103 and on the masks 104, a gate material 101 is deposited. Thus, the gate material 101 is deposited between the multiple fins 102, so that the multiple fins 102 and the masks 104 are covered with the gate material 101. The gate material 101 is made of, for example, $\alpha$-Si. On the gate material 101, an upper mask 100 is formed. The upper mask 100 is extended along an X-direction. The upper mask 100 is made of, for example, SiN. When the process of block S10 of FIG. 9 is ended, a process of block S12 of removing a surface oxide film is carried out.

At block S12 (remove surface oxide film), the control unit Cnt removes a native oxide film formed on the surface of the target object W. When the process of block S12 is ended, a main etching process of block S14 (first etching process) is carried out.

Figure 11A:
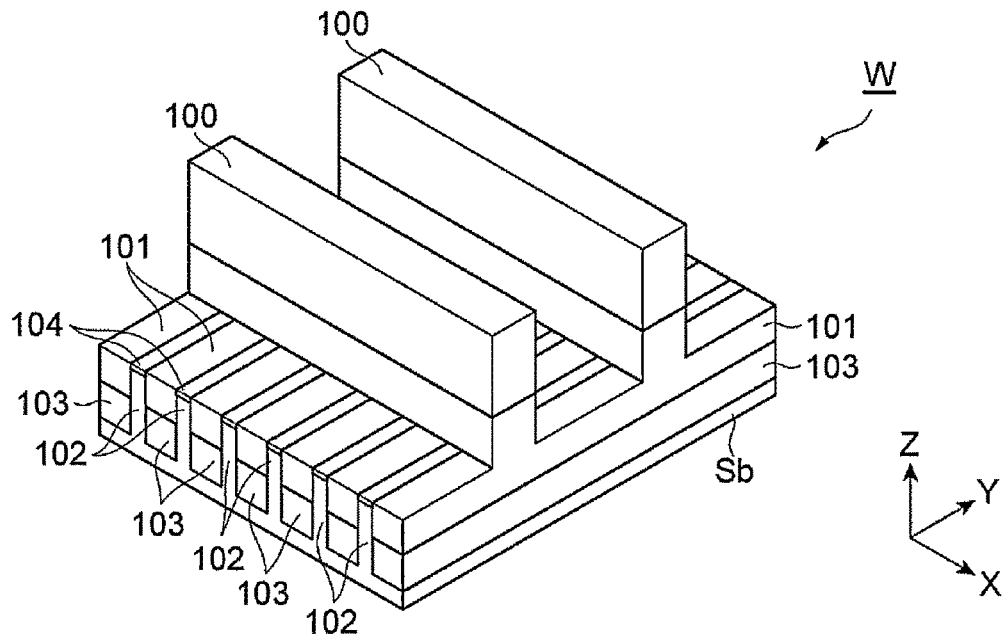
FIG. 11A to FIG. 11C illustrate a main etching process.
Figure 11B:
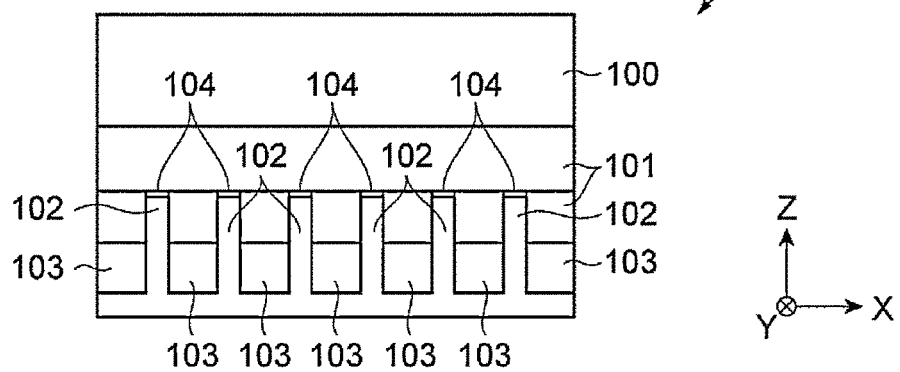
Figure 11C:
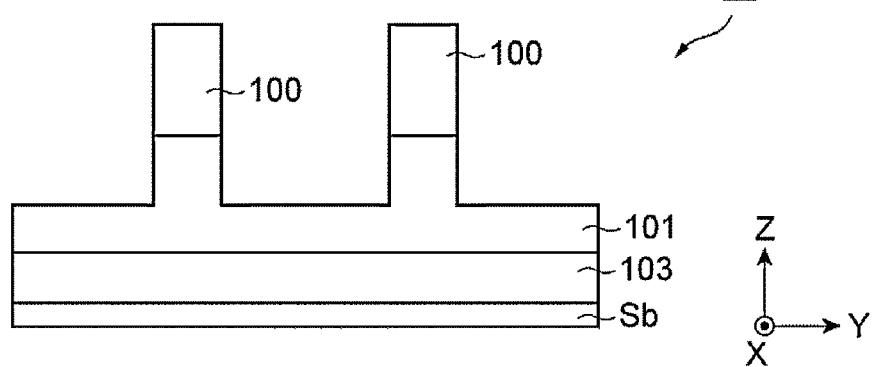

AT block S14 (main etching process (etching until upper surface of mask is exposed)), the control unit Cnt etches the gate material 101 with the upper mask 100 on the target object W. The control unit Cnt set a pressure within the processing space S to, for example, be 50 mTorr (6.67 Pa) or higher. Then, the control unit Cnt generates plasma (surface wave plasma) using a microwave. Then, the control unit Cnt applies continuous bias power as shown in FIG. 7A to etch the gate material 101. The control unit Cnt etches the gate material 101 until upper surfaces of the masks 104 are exposed. That is, the control unit Cnt finishes the etching process of the gate material 101 on the upper surfaces of the masks 104. FIG. 11A is a perspective view of the target object W after the main etching process, FIG. 11B is a side view of the target object W after the main etching process, and FIG. 11C is a front view of the target object W after the main etching process. As shown in FIG. 11A to FIG. 11C, since the gate material 101 is etched, the masks 104 are exposed. Between the adjacent fins 102, the gate material 101 still remains. When the process of block S14 of FIG. 9 is ended, a dummy gate etching process of block S16 (second etching process) is carried out.

Figure 12A:
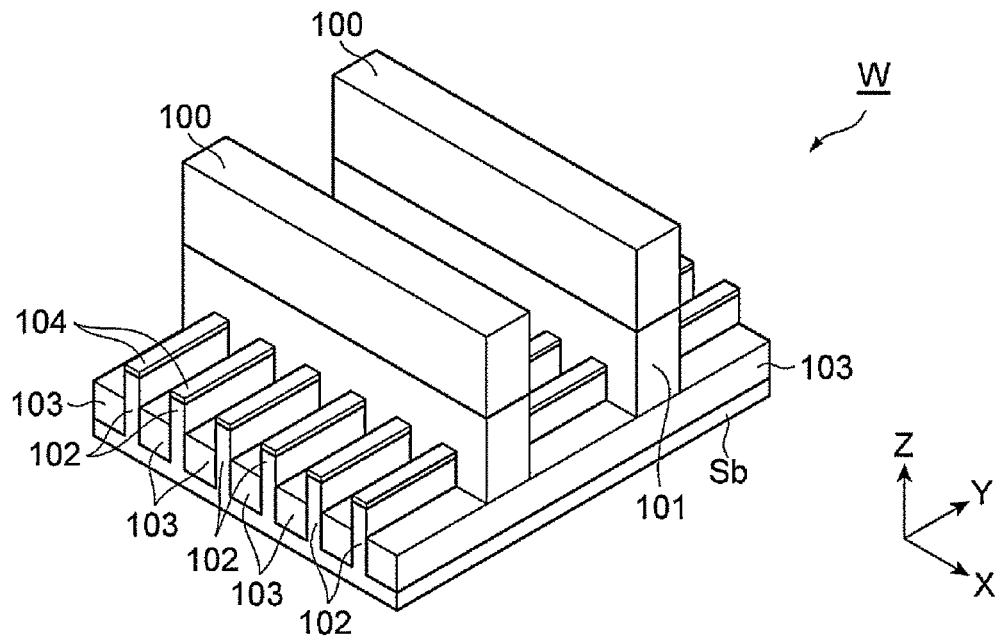
FIG. 12A to FIG. 12C illustrate a dummy gate etching process.
Figure 12B:
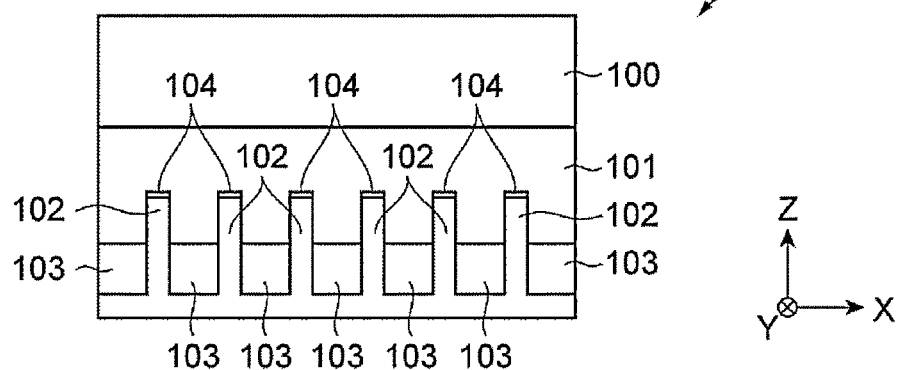
Figure 12C:
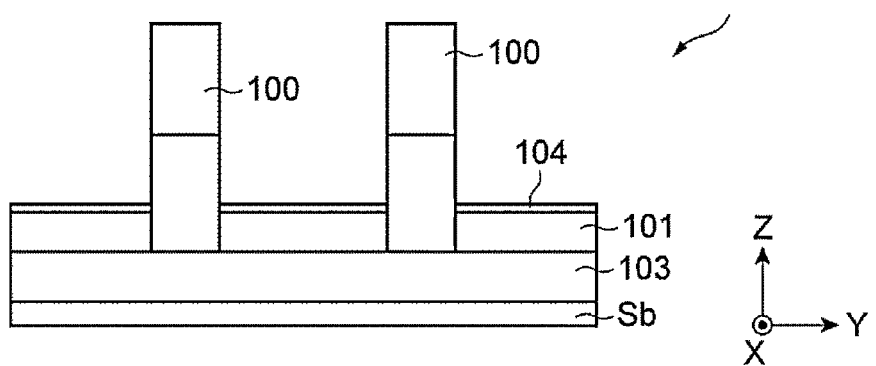

At block S16 (dummy gate etching process (over-etching of pulse modulation bias)), the control unit Cnt over-etches the gate material 101 with the upper mask 100 and the masks 104 on the target object W. The control unit Cnt sets a pressure within the processing space S to, for example, be 50 mTorr (6.67 Pa) or higher. Then, the control unit Cnt generates plasma (surface wave plasma) using a microwave. Further, the control unit Cnt may continuously generate plasma from the main etching process. Then, the control unit Cnt applies the pulsed-bias power as shown in FIG. 7B to etch the gate material 101. A frequency of the bias power is in a range of 10 Hz to 300 Hz, 10 Hz to 200 Hz, or 10 Hz to 100 Hz. Further, a duty ratio of the bias power is 50% or less. Thus, the control unit Cnt etches the gate material 101 until upper surface of the thermal oxide film 103 is exposed. FIG. 12A is a perspective view of the target object W after the over-etching process, FIG. 12B is a side view of the target object W after the over-etching process, and FIG. 12C is a front view of the target object W after the over-etching process. As shown in FIG. 12A to FIG. 12C, the gate material 101 remaining between the adjacent fins 102 is removed. When the process of block S16 of FIG. 9 is ended, a control process as shown in FIG. 9 is ended.

According to the etching method as shown in FIG. 9, in the over-etching process of etching the gate material 101 between the fins 101 which is required in the micro-processing, the surface wave plasma is used. Since the surface wave plasma is used, plasma can be generated even at a high pressure of 50 mTorr (6.67 Pa) or higher. Further, since the etching process is carried out under the high pressure condition of 50 mTorr (about 6.67 Pa) or higher, selectivity can be improved.

Hereinafter, a selectivity improvement effect under a high pressure condition will be briefly explained. In order to improve selectivity, it is necessary to carry out soft etching that does not cause damage to a sample, and in order to do so, it is necessary to lower energy of ions reaching the target object W. Under a high pressure condition, ions can be collided with neutral particles within a sheath to lose their energy. Whether or not ions are collided with the neutral particles within the sheath can be expected using a sheath thickness and a mean free path. Assuming that a thickness of a Child-law sheath is s, a mean free path is λ, an electron temperature (eV) is $T_e$, an electron density ($1.0\times10^{10}$ cm$^{-3}$) is $n_0$, an applied voltage (V) is $V_0$, and a pressure (mTorr) is P, a ratio γ of the sheath thickness s and the mean free path λ is expressed by the following equation.

$$\gamma = \frac{s}{\lambda} = 7.2\times10^{-4}\sqrt{\frac{T_e}{n_0}}\cdot\left(\frac{2\cdot V_0}{T_e}\right)^{\frac{3}{4}}\cdot P \quad \text{[Equation 1]}$$

Figure 13:
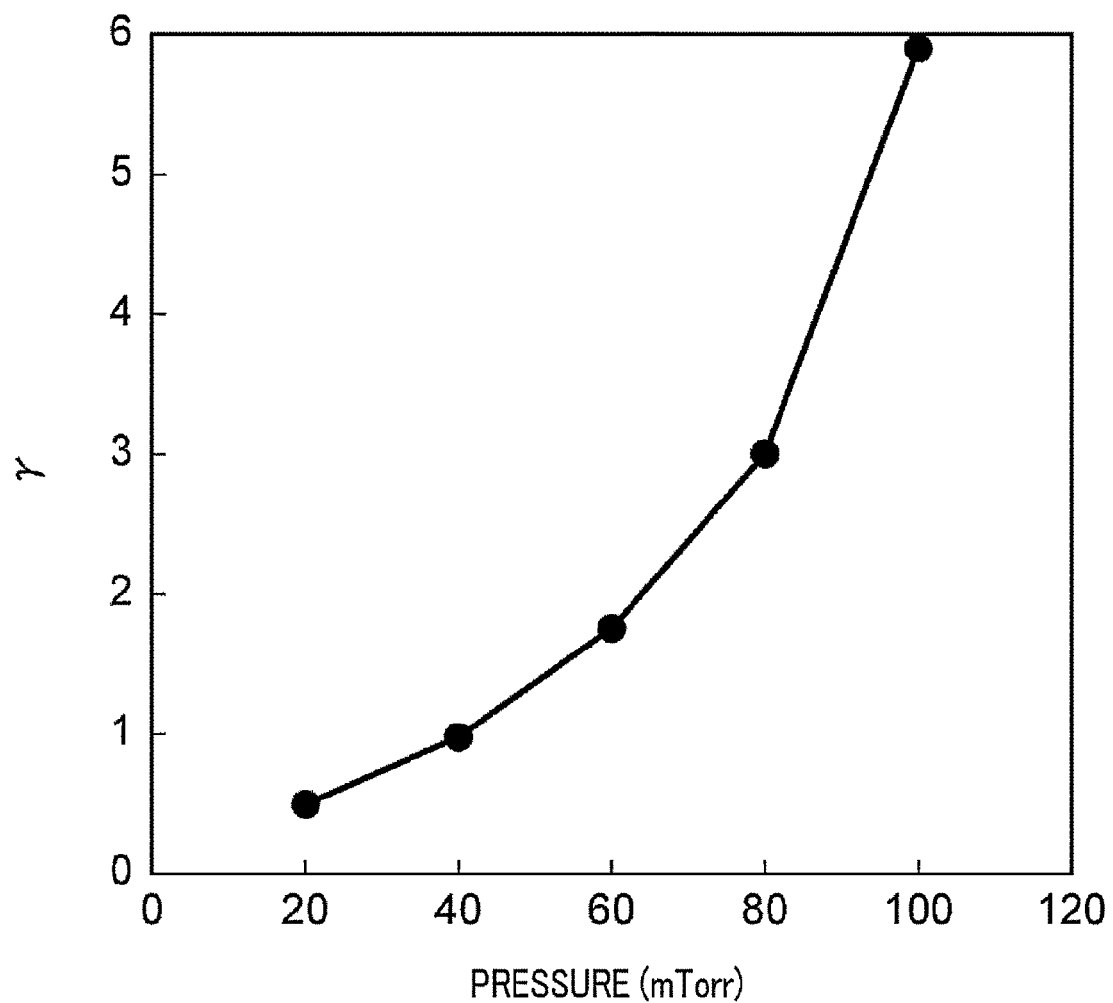
FIG. 13 is a graph showing dependency of a ratio of a sheath thickness and a mean free process on a pressure.

The above equation shows that the ratio γ depends on the pressure P. Further, in the case of $N_2$, when the pressure P is 20 mTorr (2.67 Pa), the electron temperature $T_e$ is about 1.08 eV, the electron density $n_0$ is about $2.3\times10^{10}$ cm$^{-3}$. Further, when the pressure P is 40 mTorr (5.33 Pa), the electron temperature $T_e$ is about 0.81 eV, the electron density $n_0$ is about $2.7\times10^{10}$ cm$^{-3}$. Furthermore, when the pressure P is 100 mTorr (13.33 Pa), the electron temperature $T_e$ is about 0.59 eV, the electron density $n_0$ is about $0.55\times10^{10}$ cm$^{-3}$. If the applied voltage $V_0$ is 100 V, a graph showing dependency of the ratio γ on a pressure can be drawn as shown in FIG. 13. It is shown that if the ratio γ is 1, the sheath thickness s is equal to the mean free path λ. It is shown that if the ratio γ is higher than 1, the mean free path λ is smaller than the sheath thickness s. Therefore, it is presumed that ions are collided with the neutral particles within the sheath at least once. It can be seen from the graph of FIG. 13 that in the case of about 40 mTorr (about 5.33 Pa) or more, at least 50 mTorr (6.67 Pa) or more, ion energy is reduced, so that the soft etching that does not cause damage to a sample can be carried out. Therefore, since an etching process is carried out under a high pressure condition of at least 50 mTorr (6.67 Pa) or more, selectivity of the masks 104 and the gate material 101 is improved.

Further, according to the etching method in accordance with the present example embodiment, since the surface wave plasma having a lower electron temperature than other plasma sources is used, by-products do not adhere to the target object W and are exhausted. Thus, an effect of the by-products can be reduced. Furthermore, since the bias power is pulse-modulated, the surface of the target object W is re-oxidized during an OFF-time of a pulse, so that it is possible to improve selectivity of the mask and the gate material. In particular, by setting the frequency of the bias power to be in the range of 10 Hz or more to 200 Hz or less and pulse-modulating the bias power such that the duty ratio can be 50% or less, it is possible to obtain a time for exhausting the by-products. In general, the time for exhausting the by-products just needs to be a time for exhausting etching by-products within the plasma sheath. By way of example, if a pressure within the processing space S is 100 mTorr (13.33 Pa) and an exhaustion rate is 1000 sccm, a time for exhausting a capacity corresponding to a volume of a sheath (having a thickness of several mm) is in a range of about 0.4 ms to about 1.0 ms. In case of setting the frequency of bias power to be in a range of 10 Hz or more to 200 Hz or less and pulse-modulating the bias power such that the duty ratio can be 50% or less, an OFF-time is 2.5 ms or more. Accordingly, it is possible to obtain a sufficient time for exhausting the by-products. For this reason, it is possible to suppress adhesion of the by-products to a sidewall, and also possible to suppress obstruction of etching caused by the by-products remaining between the fins 102. Therefore, it is possible to improve verticality of the etching profile as well as secure selectivity.

Further, according to the etching method of the present example embodiment, in the main etching process, an etching rate is maintained by continuously applying the bias power, and the soft etching can be carried out by pulse-modulating the bias power only in the dummy gate etching process after the main etching process. By adjusting the bias power, the etching process can be carried out such that a process accuracy demanded in each process can be achieved without a great change in a processing condition. Further, since the processes are consecutively carried out in the same processing chamber, it is possible to form a dummy gate of a fin-type field effect transistor while securing a throughput.

The example embodiments are not limited to the above, and can be changed and modified in various ways without departing from the spirit of the invention. By way of example, the main etching process may be carried out by an apparatus using a certain plasma source instead of a plasma processing apparatus using a microwave. Such an apparatus may include, for example, a parallel plate-type plasma processing apparatus or an electron cyclotron resonance-type plasma processing apparatus.

Hereinafter, there will be experimental examples carried out to evaluate the etching method performed in the plasma processing apparatus 10. Further, the example embodiments are not limited to the following experimental examples.

Experimental Example 1

In an experimental example 1, whether or not selectivity of the masks 104 and the gate material 101 is improved under a high pressure condition of about 50 mTorr (about 6.67 Pa) or more was verified. A sample including silicon oxide as a mask on polysilicon was prepared and then etched while changing the pressure condition in the plasma processing apparatus depicted in FIG. 1, and selectivity was measured. As an etching gas, an Ar/HBr/$O_2$ gas was used. A result thereof is as shown in FIG. 14.

Figure 14:
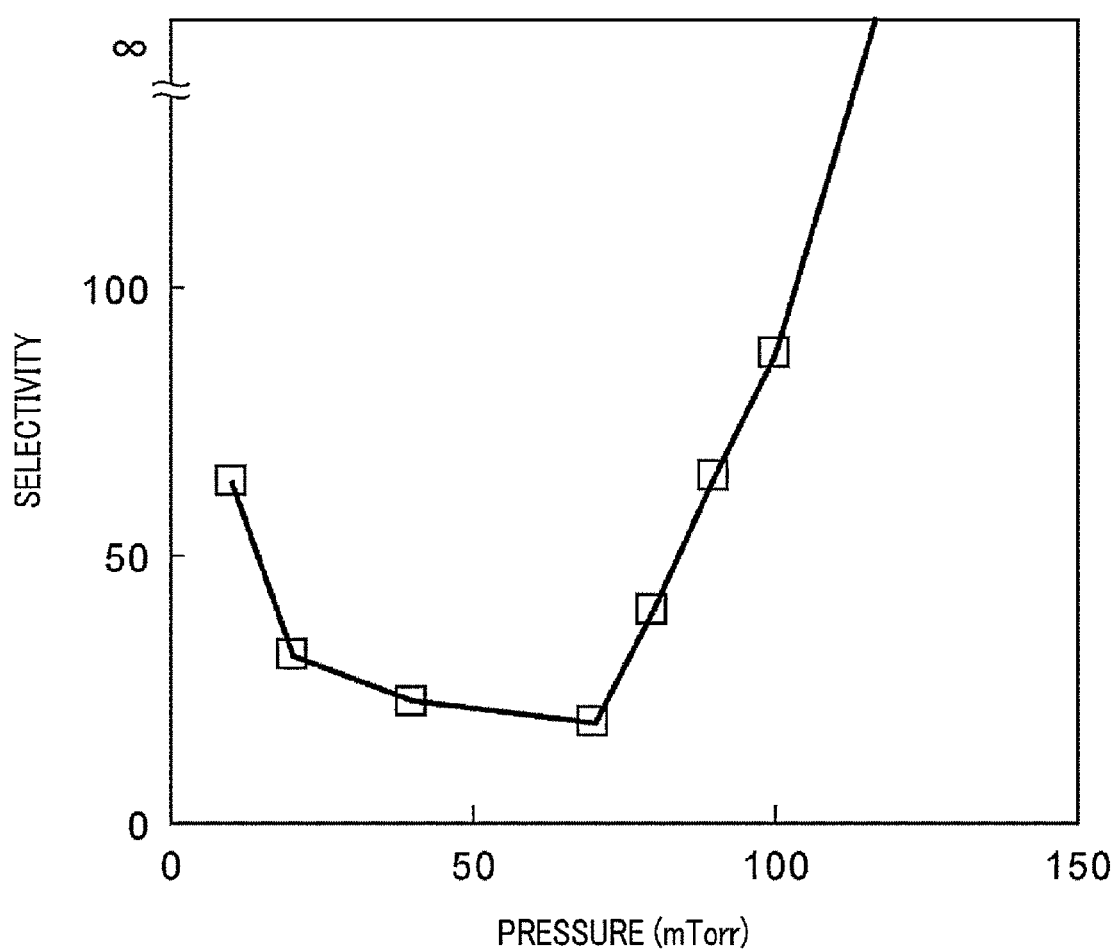
FIG. 14 is a graph showing dependency of selectivity of polysilicon and silicon oxide on a pressure.

FIG. 14 is a graph showing dependency of selectivity on a pressure. As shown in FIG. 14, it was verified that selectivity had a minimum value at a pressure of about 50 mTorr (about 6.67 Pa). Therefore, it was verified that in the case of setting the pressure to be 50 mTorr (about 6.67 Pa) or more, selectivity of the masks 104 and the gate material 101 is improved. Further, it was verified that the result of the experimental example 1 is the same as a result derived from the graph showing the dependency of the ratio γ of the sheath thickness s and the mean free path X on a pressure as shown in FIG. 13, and has the same tendency as a result calculated theoretically.

Experimental Example 2

Figure 16:
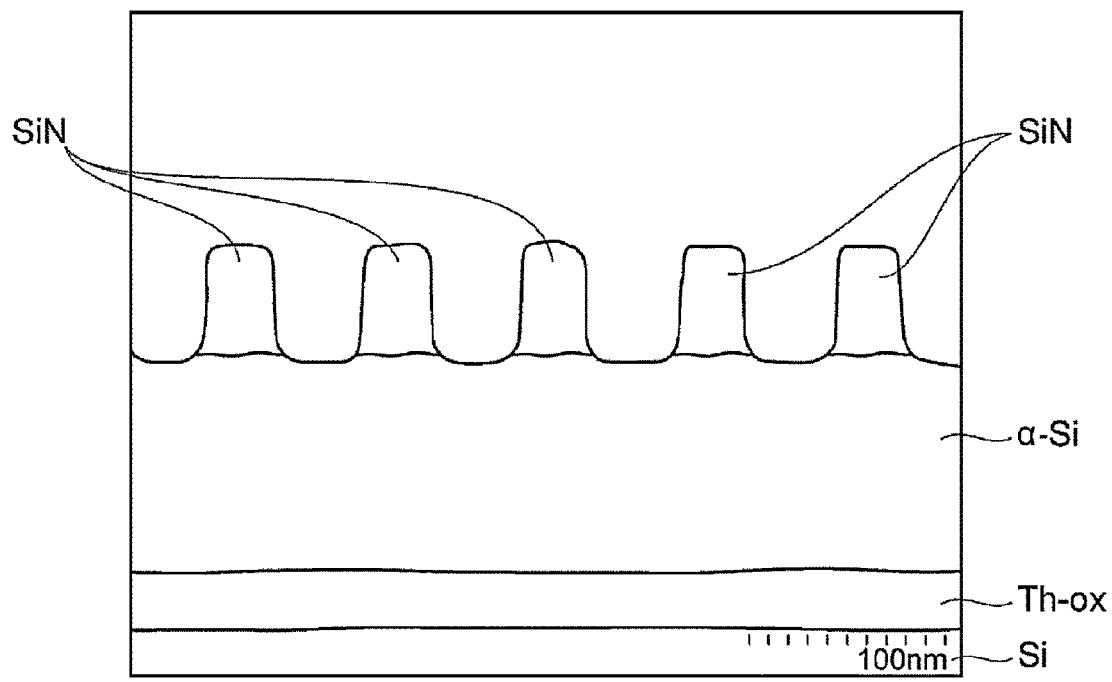
FIG. 16 is a schematic diagram of a sample used in the experimental example.

In an experimental example 2, a control condition of a bias power pulse for an optimum etching rate was verified. FIG. 15 shows the verified pulse control condition. As shown in FIG. 15, the frequency of the bias voltage was set to 10 Hz, 50 Hz, 100 Hz, 200 Hz, and 500 Hz. The duty ratio of the bias voltage was set to 25%, 50%, and 75%. FIG. 15 shows an ON-time and an OFF-time under each condition. The other processing conditions in the experimental example 2 were as follows.
  Pressure within the processing chamber 12: 120 mTorr (16.00 Pa)
  Microwave: 2.45 GHz, 1700 W
  High frequency bias power: 200 W
  Processing gas:
  Flow rate of Ar gas: 1000 sccm
  Flow rate of HBr gas: 800 sccm
  Flow rate of $O_2$ gas: 11 sccm
  Processing time: 20 seconds
  A target object W used in the experimental example 2 is as shown in FIG. 16. In the target object W shown in FIG. 16, Th-ox of 30 nm as a thermal oxide film and an α-Si film of 100 nm were stacked on Si as a substrate, and masks made of SiN were equi-spaced on the α-Si film.

Figure 17A:
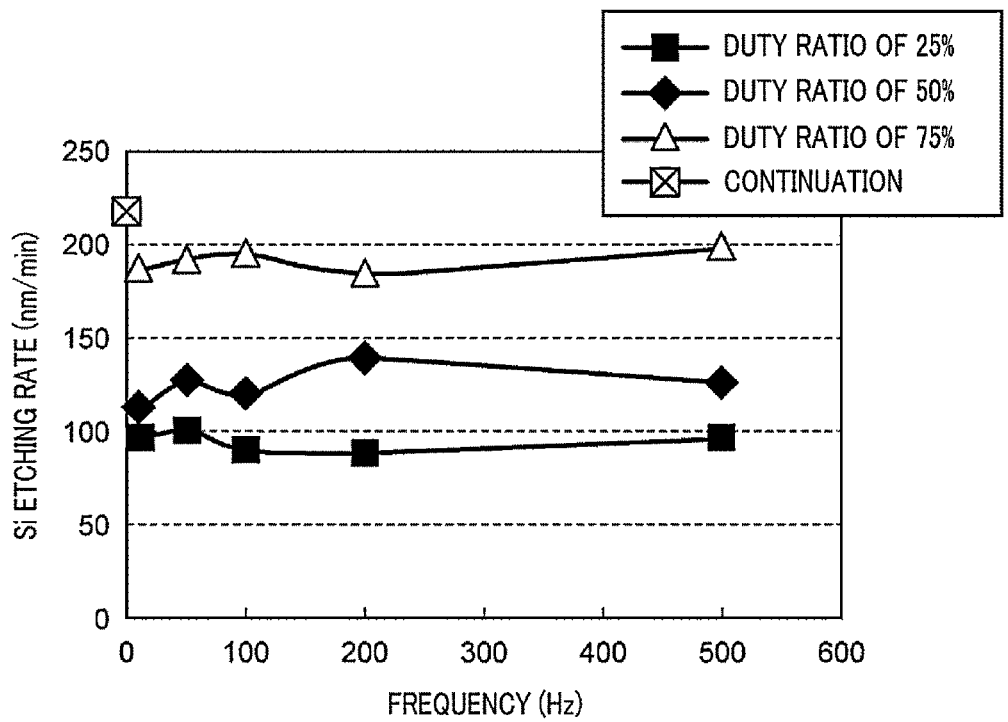
FIGS. 17A and 17B show dependency of a Si etching rate at each duty ratio on a frequency.
Figure 17B:
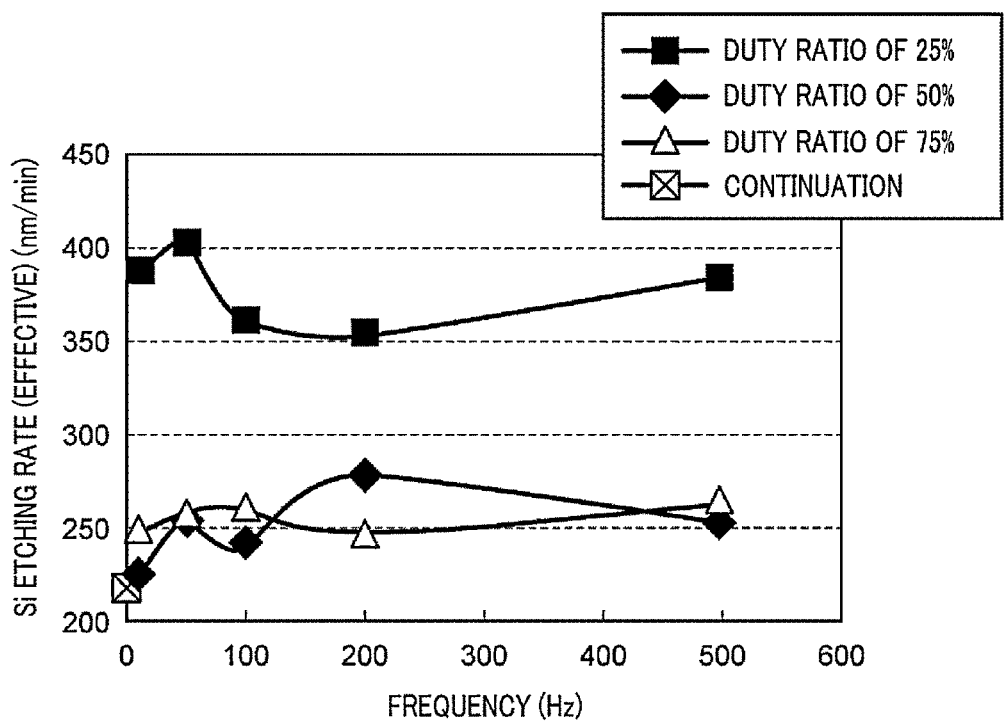

The α-Si film of the target object W shown in FIG. 16 was etched under the processing conditions shown in FIG. 15, and measurement results of dependency of an etching rate on a frequency are as shown in FIG. 17A and FIG. 17B. FIG. 17A and FIG. 17B show graphs when a duty ratio of a bias power pulse was set to 25%, 50%, and 75%, and also when bias power was continuously applied. FIG. 17A shows dependency of an etching rate on a frequency, and a horizontal axis represents a frequency and a longitudinal axis represents an etching rate. FIG. 17B shows an effective etching rate obtained by dividing an etched amount by a total ON-time, and a horizontal axis represents a frequency and a longitudinal axis represents an etching rate. As shown in FIG. 17A, it was verified that the etching rates are almost constant at all of the duty ratios without depending on the frequency. Further, as shown in FIG. 17B, it was verified that etching efficiency during the ON-time is increased at the duty ratio of 50% or 25%. Therefore, it was verified that etching efficiency is higher when the duty ratio of the bias power pulse is 50% or less.

Experimental Example 3

Figure 18:
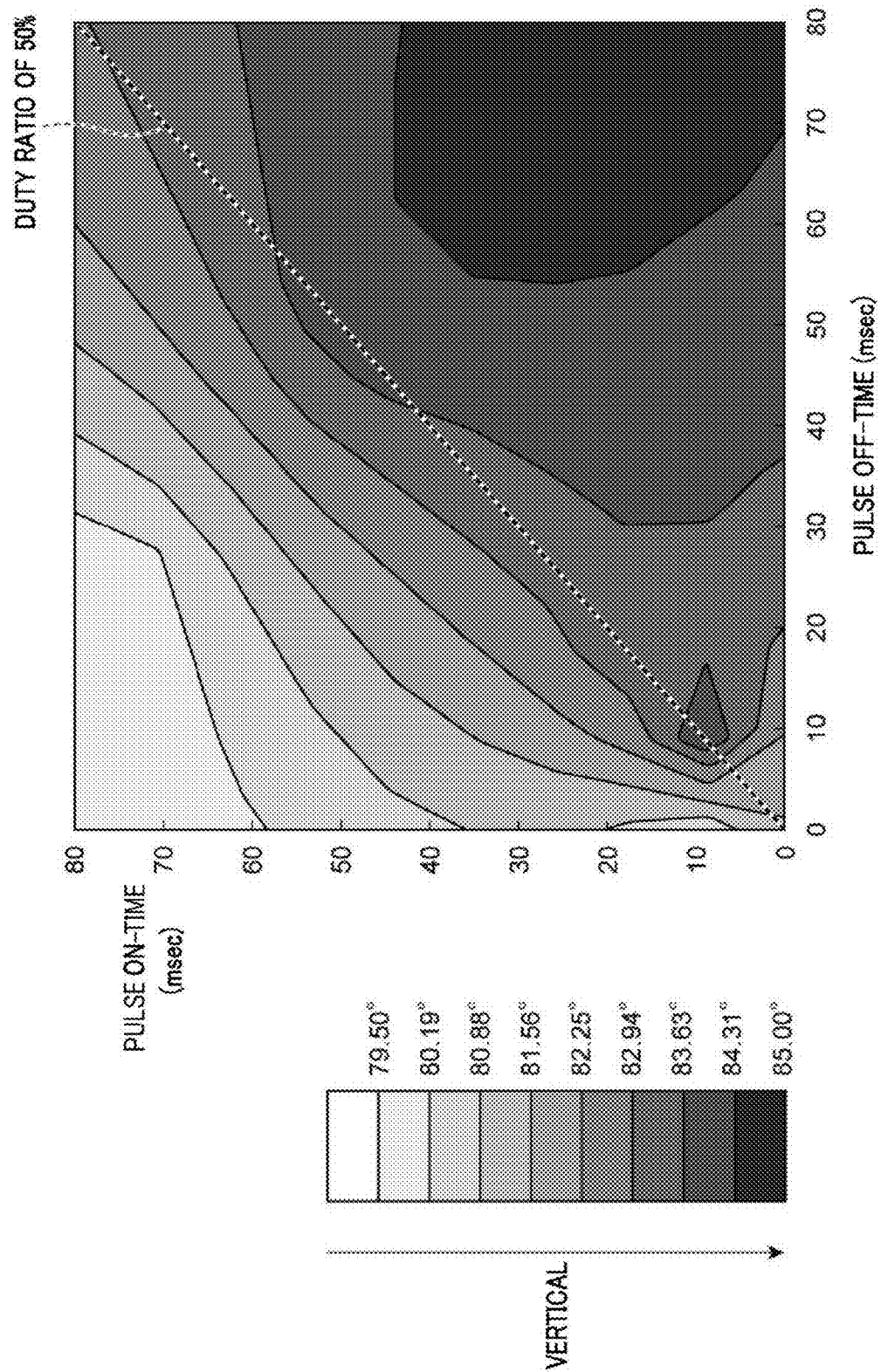
FIG. 18 is a graph showing a relationship of an ON-time and an OFF-time, and verticality in shape.

In an experimental example 3, a control condition of a bias power pulse for optimum profile verticality was verified. The verified pulse control condition and the target object W were the same as those of the experimental example 2. A shape (an angle in a vertical direction) between the SiNs of the etched target object W was measured under each processing condition. A result thereof is as shown in FIG. 18. FIG. 18 shows a mapping result of shapes (angles in the vertical direction) when a longitudinal axis represents an ON-time of the pulse and a horizontal axis represents an OFF-time of the pulse. In FIG. 18, a measured angle closer to 90° is expressed in darker black. As shown in FIG. 18, it was verified that an angle is 82.94° or more at a duty ratio of about 50% as a boundary of expressed by a dotted line. That is, it was verified that when the duty ratio of the bias power pulse is 50% or less, the profile verticality is improved.

Experimental Example 4

Figure 19A:
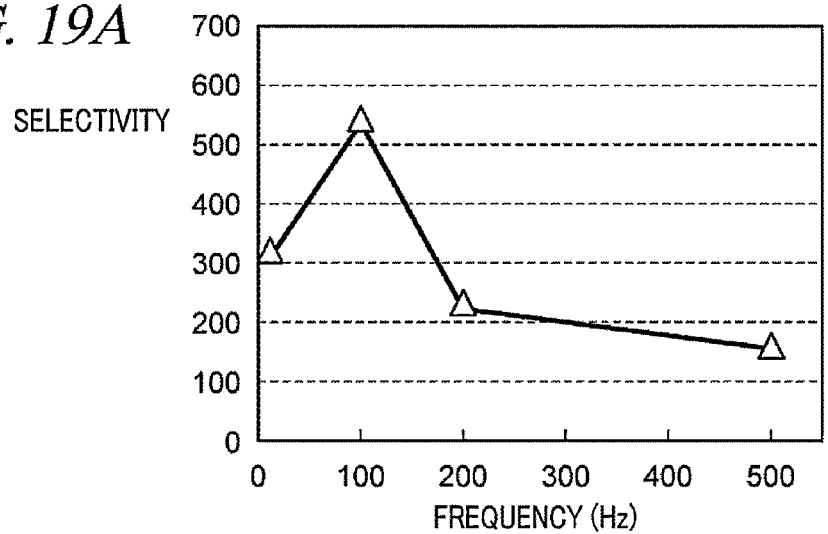
FIG. 19A to 19C show dependency of selectivity of polysilicon and silicon oxide at each duty ratio on a frequency.
Figure 19B:
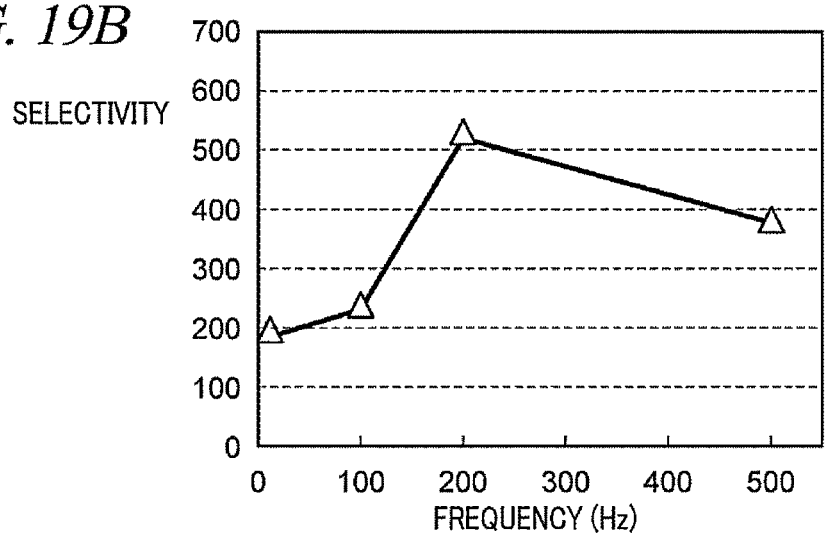
Figure 19C:
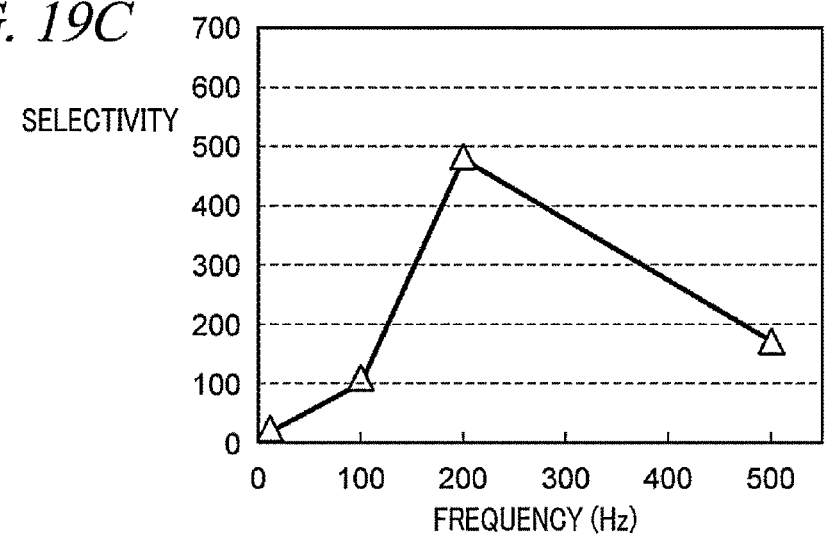

In an experimental example 4, a control condition of a bias power pulse for optimum selectivity was verified. The verified pulse control condition and the target object W were the same as those of the experimental example 2. An etching process was carried out under each processing condition and selectivity was measured. Results thereof are as shown in FIG. 19A to FIG. 19C. FIG. 19A to FIG. 19C are graphs showing dependency of selectivity on a frequency, and a longitudinal axis represents selectivity and a horizontal axis represents a frequency. FIG. 19A shows a graph in the case of a duty ratio of 25%, FIG. 19B shows a graph in the case of a duty ratio of 50%, and FIG. 19C shows a graph in the case of a duty ratio of 75%. As shown in FIG. 19A, it was verified that in the case of setting a duty ratio of 25%, if the frequency is increased from zero, the selectivity has a maximum value at 100 Hz and a value at 200 Hz is substantially the same as a value at 0 Hz, and as the frequency becomes higher than 200 Hz, the selectivity is decreased. Further, as shown in FIG. 19B, it was verified that in the case of setting a duty ratio of 50%, if the frequency is increased from zero, the selectivity has a maximum value at 200 Hz, and as the frequency becomes higher than 200 Hz, the selectivity is decreased. Furthermore, as shown in FIG. 19C, it was verified that in the case of setting a duty ratio of 75%, if the frequency is increased from zero, the selectivity has a maximum value at about 200 Hz, and as the frequency becomes higher than 200 Hz, the selectivity is decreased. As such, it was verified that at all of the duty ratios, if the frequency is increased from zero, the selectivity is increased and has the maximum value in a range of 100 Hz to 200 Hz. Further, it was verified that at the duty ratio of 50% or less, the selectivity of about 200 or more can be obtained in a range of 200 Hz or less.

We claim:
1. An etching method of forming a dummy gate of a fin-type field effect transistor with a target object including multiple fins, masks formed on the multiple fins, and a gate material deposited between the multiple fins and deposited on upper surfaces of the masks, the etching method comprising:
  a first etching process of etching the gate material until the upper surfaces of the masks are exposed; and
  a second etching process of etching the gate material deposited between the multiple fins by using surface wave plasma,
  wherein a pressure in the second etching process is about 50 mTorr (about 6.67 Pa) or more, and
  in the second etching process, a frequency of a power to be applied to a mounting table configured to mount thereon the target object is in a range of about 10 Hz or more to about 200 Hz or less, and the power is pulse-modulated such that a duty ratio as a ratio of an ON-time to a pulse cycle is about 50% or less.
2. The etching method of claim 1,
  wherein, in the first etching process, the gate material is etched without pulse-modulating the power to be applied to the mounting table.

3. The etching method of claim 1,
wherein the first etching process and the second etching process are consecutively carried out in the same processing chamber by using the surface wave plasma.

* * * * *

UNITED STATES PATENT AND TRADEMARK OFFICE
CERTIFICATE OF CORRECTION

| | | |
|---|---|---|
| PATENT NO. | : 9,087,798 B2 | Page 1 of 1 |
| APPLICATION NO. | : 14/456059 | |
| DATED | : July 21, 2015 | |
| INVENTOR(S) | : Hiroto Ohtake et al. | |

It is certified that error appears in the above-identified patent and that said Letters Patent is hereby corrected as shown below:

In the specification, column 15, line 8, please replace "X" with -- $\lambda$ --

Signed and Sealed this
Twelfth Day of January, 2016

Michelle K. Lee
*Director of the United States Patent and Trademark Office*